United States Patent
Miyanaga et al.

(10) Patent No.: US 9,306,075 B2
(45) Date of Patent: Apr. 5, 2016

(54) THIN FILM TRANSISTOR

(71) Applicant: SEMICONDUCTOR ENERGY LABORATORY CO., LTD., Atsugi-shi, Kanagawa-ken (JP)

(72) Inventors: Akiharu Miyanaga, Kanagawa (JP); Junichiro Sakata, Kanagawa (JP); Masayuki Sakakura, Tochigi (JP); Masahiro Takahashi, Tokyo (JP); Hideyuki Kishida, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/621,838

(22) Filed: Feb. 13, 2015

(65) Prior Publication Data

US 2015/0162450 A1    Jun. 11, 2015

Related U.S. Application Data

(63) Continuation of application No. 14/297,733, filed on Jun. 6, 2014, now Pat. No. 8,936,149, which is a continuation of application No. 12/950,186, filed on Nov. 19, 2010, now Pat. No. 8,766,250.

(30) Foreign Application Priority Data

Nov. 20, 2009   (JP) .................................. 2009-265409

(51) Int. Cl.
   *H01L 29/10*   (2006.01)
   *H01L 29/786*  (2006.01)

(52) U.S. Cl.
   CPC ............ *H01L 29/7869* (2013.01); *H01L 29/10* (2013.01)

(58) Field of Classification Search
   CPC ............................ H01L 29/10; H01L 29/7869
   USPC ............................................................. 257/43
   See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| | (Continued) | |

FOREIGN PATENT DOCUMENTS

| | | |
|---|---|---|
| EP | 1737044 A | 12/2006 |
| EP | 2226847 A | 9/2010 |
| | (Continued) | |

OTHER PUBLICATIONS

Miyanaga. A et al., "Specification U.S. Appl. No. 12/900,136".

(Continued)

*Primary Examiner* — Ajay K Arora
(74) *Attorney, Agent, or Firm* — Fish & Richardson P.C.

(57) ABSTRACT

A thin film transistor including an oxide semiconductor with favorable electrical characteristics is provided. The thin film transistor includes a gate electrode provided over a substrate, a gate insulating film provided over the gate electrode, an oxide semiconductor film provided over the gate electrode and on the gate insulating film, a metal oxide film provided on the oxide semiconductor film, and a metal film provided on the metal oxide film. The oxide semiconductor film is in contact with the metal oxide film, and includes a region whose concentration of metal is higher than that of any other region in the oxide semiconductor film (a high metal concentration region). In the high metal concentration region, the metal contained in the oxide semiconductor film may be present as a crystal grain or a microcrystal.

20 Claims, 14 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,106 B2 | 8/2010 | Chang |
| 7,791,074 B2 | 9/2010 | Iwasaki |
| 8,063,421 B2 | 11/2011 | Kang et al. |
| 8,304,773 B2 | 11/2012 | Shimada |
| 8,779,418 B2 | 7/2014 | Miyanaga et al. |
| 9,006,729 B2 * | 4/2015 | Akimoto et al. ............... 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197344 A1 | 8/2008 | Yano et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0200857 A1 | 8/2010 | Shimada |
| 2010/0224873 A1 | 9/2010 | Sakata et al. |
| 2010/0276689 A1 | 11/2010 | Iwasaki |
| 2010/0279462 A1 | 11/2010 | Iwasaki |
| 2011/0084269 A1 | 4/2011 | Yamazaki et al. |
| 2011/0084272 A1 | 4/2011 | Miyanaga et al. |
| 2011/0108833 A1 | 5/2011 | Yamazaki et al. |
| 2011/0108834 A1 | 5/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-103918 A | 4/2007 |
| JP | 2007-123861 A | 5/2007 |
| JP | 2008-042067 A | 2/2008 |
| JP | 2008-205469 A | 9/2008 |
| JP | 2008-219008 A | 9/2008 |
| JP | 2008-270313 A | 11/2008 |
| JP | 2009-141001 A | 6/2009 |
| JP | 2010-232647 A | 10/2010 |
| JP | 2011-109031 A | 6/2011 |
| KR | 2008-0079906 A | 9/2008 |
| WO | WO-2004/114391 | 12/2004 |
| WO | WO-2007/029844 | 3/2007 |
| WO | WO-2008/099863 | 8/2008 |
| WO | WO-2009/072533 | 6/2009 |

OTHER PUBLICATIONS

International Search Report (Application No. PCT/JP2010/069391) Dated Dec. 28, 2010.

(56) References Cited

OTHER PUBLICATIONS

Written Opinion (Application No. PCT/JP2010/069391) Dated Dec. 28, 2010.
Asakuma. N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka. Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern. H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho. D et al., "21.2:AL and SN-Doped Zinc Indium Oxide Thin Film Transistors for Amoled Back-Plane", SID Digest '09: SID International Symposium Digest of Technical Papers, May 31, 2009, pp. 280-283.
Clark. S et al., "First Principles Methods Using CASTEP", Zeitschrift fur Kristallographie, 2005, vol. 220, pp. 567-570.
Coates. D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Costello. M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo. H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato. E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.
Fung. T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Godo. H et al., "P-9: Numerical Analysis on Temperature Dependence of Characteristics of Amorphous In-Ga-Zn-Oxide TFT", SID Digest '09: SID International Symposium Digest of Technical Papers, May 31, 2009, pp. 1110-1112.
Godo. H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Hayashi. R et al., "42.1: Invited Paper: Improved Amorphous In-Ga-Zn-O TFTS", SID Digest '08: SID International Symposium Digest of Technical Papers, May 20, 2008, vol. 39, pp. 621-624.
Hirao. T et al., "Novel Top-Gate Zinc Oxide Thin-Film Transistors (ZNO TFTS) for AMLCDS", J. Soc. INF. Display (Journal of the Society for Information Display), 2007, vol. 15, No. 1, pp. 17-22.
Hosono. H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono. H, "68.3: Invited Paper: Transparent Amorphous Oxide Semiconductors for High Performance TFT", SID Digest '07: SID International Symposium Digest of Technical Papers, 2007, vol. 38, pp. 1830-1833.
Hsieh. H et al., "P-29: Modeling of Amorphous Oxide Semiconductor Thin Film Transistors and Subgap Density of States", SID Digest '08: SID International Symposium Digest of Technical Papers, May 20, 2008, vol. 39, pp. 1277-1280.
Ikeda. T et al., "Full-Functional System Liquid Crystal Display Using CG-Silicon Technology", SID Digest '04: SID International Symposium Digest of Technical Papers, 2004, vol. 35, pp. 860-863.
Janotti. A et al., "Native Point Defects in ZnO", Phys. Rev. B (Physical Review. B), Oct. 4, 2007, vol. 76, No. 16, pp. 165202-1-165202-22.
Janotti. A et al., "Oxygen Vacancies In ZnO", Appl. Phys. Lett. (Applied Physics Letters), 2005, vol. 87, pp. 122102-1-122102-3.
Jeong. J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.
Jin. D et al., "65.2: Distinguished Paper: World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Kanno. H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi. H et al., "39.1: Invited Paper: Optically Isotropic Nano-Structured Liquid Crystal Composites for Display Applications", SID Digest '09: SID International Symposium Digest of Technical Papers, May 31, 2009, pp. 578-581.
Kikuchi. H et al., "62.2: Invited Paper: Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.
Kikuchi. H et al., "Polymer-Stabilized Liquid Crystal Blue Phases", Nature Materials, Sep. 2, 2002, vol. 1, pp. 64-68.
Kim. S et al., "High-Performance oxide thin film transistors passivated by various gas plasmas", 214TH ECS Meeting, 2008, No. 2317, ECS.
Kimizuka. N et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] At Temperatures Over 1000°C", Journal of Solid State Chemistry, 1985, vol. 60, pp. 382-384.
Kimizuka. N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.
Kitzerow. H et al., "Observation of Blue Phases in Chiral Networks", Liquid Crystals, 1993, vol. 14, No. 3, pp. 911-916.
Kurokawa. Y et al., "UHF RFCPUS on Flexible and Glass Substrates for Secure RFID Systems", Journal of Solid-State Circuits, 2008, vol. 43, No. 1, pp. 292-299.
Lany. S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee. H et al., "Current Status of, Challenges to, and Perspective View of AM-OLED", IDW '06: Proceedings of the 13th International Display Workshops, Dec. 7, 2006, pp. 663-666.
Lee. J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.
Lee. M et al., "15.4: Excellent Performance of Indium-Oxide-Based Thin-Film Transistors by DC Sputtering", SID Digest '09: SID International Symposium Digest of Technical Papers, May 31, 2009, pp. 191-193.
Li. C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.
Masuda. S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom. S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka. M, "SUFTLA Flexible Microelectronics on Their Way to Business", SID Digest '07: SID International Symposium Digest of Technical Papers, 2007, vol. 38, pp. 1673-1676.
Mo. Y et al., "Amorphous Oxide TFT Backplanes for Large Size AMOLED Displays", IDW '08: Proceedings of the 6th International Display Workshops, Dec. 3, 2008, pp. 581-584.

(56) References Cited

OTHER PUBLICATIONS

Nakamura. M et al., "The phase relations in the In2O3-Ga2ZnO4-ZnO system at 1350°C", Journal of Solid State Chemistry, Aug. 1, 1991, vol. 93, No. 2, pp. 298-315.

Nakamura. M, "Synthesis of Homologous Compound with New Long-Period Structure", Nirim Newsletter, Mar. 1, 1995, vol. 150, pp. 1-4.

Nomura. K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura. K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura. K et al., "Room-Temperature Fabrication of Transparent Flexible Thin-Film Transistors Using Amorphous Oxide Semiconductors", Nature, Nov. 25, 2004, vol. 432, pp. 488-492.

Nomura. K et al., "Thin-Film Transistor Fabricated in Single-Crystalline Transparent Oxide Semiconductor", Science, May 23, 2003, vol. 300, No. 5623, pp. 1269-1272.

Nowatari. H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Oba. F et al., "Defect energetics in ZnO: A hybrid Hartree-Fock density functional study", Phys. Rev. B (Physical Review. B), 2008, vol. 77, pp. 245202-1-245202-6.

Oh. M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara. H et al., "21.3:4.0 in. QVGA AMOLED Display Using In-Ga-Zn-Oxide TFTS With a Novel Passivation Layer", SID Digest '09: SID International Symposium Digest of Technical Papers, May 31, 2009, pp. 284-287.

Ohara. H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita. M et al., "Amorphous transparent conductive oxide InGaO3(ZnO)m (m<4): a Zn4s conductor", Philosophical Magazine, 2001, vol. 81, No. 5, pp. 501-515.

Orita. M et al., "Mechanism of Electrical Conductivity of Transparent InGaZnO4", Phys. Rev. B (Physical Review. B), Jan. 15, 2000, vol. 61, No. 3, pp. 1811-1816.

Osada. T et al., "15.2: Development of Driver-Integrated Panel using Amorphous In-Ga-Zn-Oxide TFT", SID Digest '09: SID International Symposium Digest of Technical Papers, May 31, 2009, pp. 184-187.

Osada. T et al., "Development of Driver-Integrated Panel Using Amorphous In-Ga-Zn-Oxide TFT", AM-FPD '09 Digest of Technical Papers, Jul. 1, 2009, pp. 33-36.

Park. J et al., "Amorphous Indium-Gallium-Zinc Oxide TFTS and Their Application for Large Size AMOLED", AM-FPD '08 Digest of Technical Papers, Jul. 2, 2008, pp. 275-278.

Park. J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park. J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park. J et al., "High performance amorphous oxide thin film transistors with self-aligned top-gate structure", IEDM 09: Technical Digest of International Electron Devices Meeting, Dec. 7, 2009, pp. 191-194.

Park. J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park. S et al., "Challenge to Future Displays: Transparent AM-OLED Driven by Peald Grown ZnO TFT", IMID '07 Digest, 2007, pp. 1249-1252.

Park. Sang-Hee et al., "42.3: Transparent ZnO Thin Film Transistor for the Application of High Aperture Ratio Bottom Emission AM-OLED Display", SIG Digest '08: SID International Symposium Digest of Technical Papers, May 20, 2008, vol. 39, pp. 629-632.

Prins. M et al., "A Ferroelectric Transparent Thin-Film Transistor", Appl. Phys. Lett. (Applied Physics Letters), Jun. 17, 1996, vol. 68, No. 25, pp. 3650-3652.

Sakata. J et al., "Development of 4.0-In. AMOLED Display With Driver Circuit Using Amorphous In-Ga-Zn-Oxide TFTS", IDW '09: Proceedings of the 16th International Display Workshops, 2009, pp. 689-692.

Son. K et al., "42.4L: Late-News Paper: 4 Inch QVGA AMOLED Driven by the Threshold Voltage Controlled Amorphous GIZO (Ga2O3-In2O3-ZnO) TFT", SID Digest '08: SID International Symposium Digest of Technical Papers, May 20, 2008, vol. 39, pp. 633-636.

Takahashi. M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda. K et al., "Ultra Low Power Consumption Technologies for Mobile TFT-LCDs", IDW '02: Proceedings of the 19th International Display Workshops, Dec. 4, 2002, pp. 295-298.

Ueno. K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle. C, "Hydrogen as a Cause of Doping in Zinc Oxide", Phys. Rev. Lett. (Physical Review Letters), Jul. 31, 2000, vol. 85, No. 5, pp. 1012-1015.

Korean Office Action (Application No. 2014-7014982) Dated Aug. 24, 2015.

* cited by examiner

THIN FILM TRANSISTOR

CROSS-REFERENCE TO RELATED APPLICATIONS

This application is a continuation of U.S. application Ser. No. 14/297,733, filed Jun. 6, 2014, now allowed, which is a continuation of U.S. application Ser. No. 12/950,186, filed Nov. 19, 2010, now U.S. Pat. No. 8,766,250, which claims the benefit of a foreign priority application filed in Japan as Serial No. 2009-265409 on Nov. 20, 2009, all of which are incorporated by reference.

TECHNICAL FIELD

The technical field relates to a thin film transistor including an oxide semiconductor.

BACKGROUND ART

In recent years, metal oxide having semiconductor characteristics which is referred to as an oxide semiconductor has attracted attention as a novel semiconductor material which has both high mobility, which is a characteristic of polysilicon, and uniform element characteristics, which is a characteristic of amorphous silicon. Examples of the metal oxide having semiconductor characteristics are tungsten oxide, tin oxide, indium oxide, zinc oxide, and the like.

Patent Documents 1 and 2 have proposed a thin film transistor in which metal oxide having semiconductor characteristics is used for a channel formation region.

REFERENCE

[Patent Document 1] Japanese Published Patent Application No. 2007-123861
[Patent Document 2] Japanese Published Patent Application No. 2007-96055

DISCLOSURE OF INVENTION

It is an object to provide a thin film transistor including an oxide semiconductor with favorable electrical characteristics.

According to one embodiment of the present invention, a thin film transistor includes a gate electrode formed over a substrate, a gate insulating film formed over the gate electrode, an oxide semiconductor film formed over the gate electrode and on the gate insulating film, a metal oxide film formed on the oxide semiconductor film, and a metal film formed on the metal oxide film. The oxide semiconductor film is in contact with the metal oxide film, and includes a region whose metal concentration is higher than that in any other region in the oxide semiconductor film (a high metal concentration region).

In the high metal concentration region, metal contained in the oxide semiconductor film may be present as a crystal grain or a microcrystal.

According to another embodiment of the present invention, a thin film transistor includes a gate electrode formed over a substrate, a gate insulating film formed over the gate electrode, an oxide semiconductor film containing indium, gallium, and zinc, which is formed over the gate electrode and on the gate insulating film, a titanium oxide film formed on the oxide semiconductor film, and a titanium film formed on the titanium oxide film. The oxide semiconductor film is in contact with the titanium oxide film, and includes a region whose concentration of indium is higher than that in any other region in the oxide semiconductor film.

In the region whose concentration of indium is higher than that in any other region in the oxide semiconductor film, indium may be present as a crystal grain or a microcrystal.

A thin film transistor including an oxide semiconductor with favorable electrical characteristics can be provided.

BRIEF DESCRIPTION OF DRAWINGS

In the accompanying drawings.

BEST MODE FOR CARRYING OUT THE INVENTION

Embodiments of the invention are described below with reference to the drawings. Note that the invention is not limited to the following description, and those skilled in the art can easily understand that modes and details of the invention can be changed in various ways without departing from the purpose and the scope of the invention. Therefore, it should be noted that the present invention should not be interpreted as being limited to the following description of the embodiments.

Embodiment 1

Figure 1A:
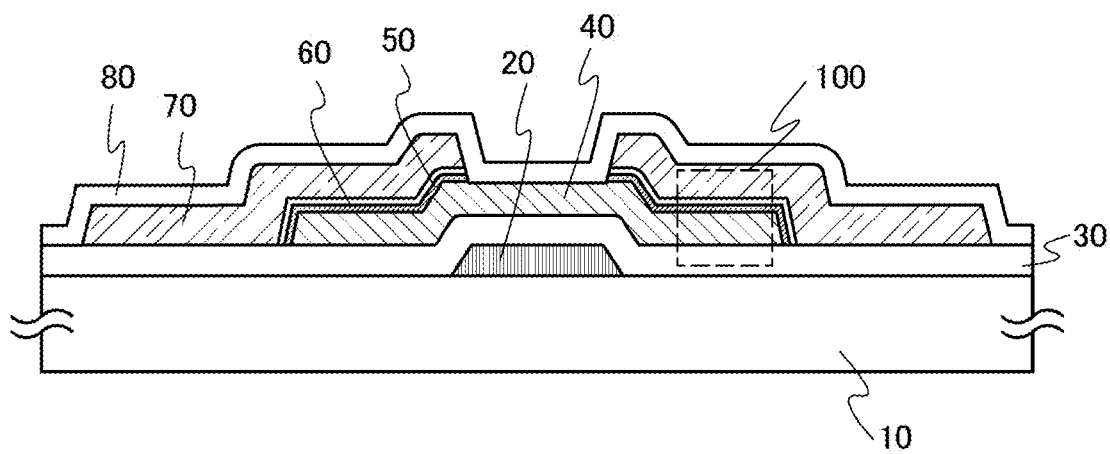
FIGS. 1A and 1B show cross sectional schematic views of a thin film transistor including an oxide semiconductor.

FIG. 1A is a cross sectional schematic view of a thin film transistor including an oxide semiconductor. This thin film transistor is formed using a substrate 10, a gate electrode 20, a gate insulating film 30, an oxide semiconductor film 40, a metal oxide film 60, a metal film 70, and an insulating film 80.

The thin film transistor shown in FIG. 1A has a bottom gate type with a channel-etched structure. Note that the type and structure of the thin-film transistor is not limited to this, and a top gate type, a bottom gate type, and the like can be used as appropriate.

As the substrate 10, a substrate having an insulating surface is used. It is appropriate that a glass substrate is used as the substrate 10. If the subsequent thermal treatment is performed at a high temperature, a glass substrate whose strain point is 730° C. or higher may be used. In addition, from the viewpoint of heat resistance, a glass substrate which contains more barium oxide (BaO) than boric acid ($B_2O_3$) is preferably used.

A substrate formed using an insulator such as a ceramic substrate, a quartz glass substrate, a quartz substrate, or a sapphire substrate may also be used as the substrate 10 instead of the glass substrate. Alternatively, a crystallized glass substrate or the like may be used as the substrate 10.

Additionally, an insulating film serving as a base film may be provided between the substrate 10 and the gate electrode 20. The base film has a function of preventing diffusion of an impurity element from the substrate 10. Note that the insulating film to be the base film may be formed using any one or more of films selected from a silicon nitride film, a silicon oxide film, a silicon nitride oxide film, and a silicon oxynitride film.

A metal conductive film can be used as the gate electrode 20. For a material of the metal conductive film, an element selected from aluminum (Al), chromium (Cr), copper (Cu), tantalum (Ta), titanium (Ti), molybdenum (Mo), and tungsten (W); an alloy containing any one of these elements as its main component; or the like can be used. For example, a three-layer structure of a titanium film, an aluminum film, and a titanium film; a three-layer structure of a molybdenum film, an aluminum film, and a molybdenum film; or the like can be used as the metal conductive film. Note that the metal conductive film is not limited to a three-layer structure, and a single layer or a two-layer structure, or a stacked structure of four or more layers may be used.

As the gate insulating film 30, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or the like can be used.

As an oxide semiconductor used for the oxide semiconductor film 40, the following metal oxide can be used: five-component metal oxide such as an In—Sn—Ga—Zn—O-based oxide semiconductor; four-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; three-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; two-component metal oxide such as an In—O-based oxide semiconductor, a Sn—O-based oxide semiconductor, and a Zn—O-based oxide semiconductor; or the like. Note that in this specification, for example, an In—Sn—Ga—Zn—O-based oxide semiconductor means metal oxide including indium (In), tin (Sn), gallium (Ga), and zinc (Zn), and the composition ratio thereof is not particularly limited. Additionally, the oxide semiconductor film 40 may contain silicon oxide ($SiO_2$).

In addition, for the oxide semiconductor film 40, an oxide semiconductor with a structure represented by $InMO_3(ZnO)_m$ (m>0) can also be used. Note here that M denotes a single metal element or a plurality of metal elements selected from gallium (Ga), aluminum (Al), manganese (Mn), and cobalt (Co). Examples of M are gallium, gallium and aluminum, gallium and manganese, gallium and cobalt, and the like.

Note that, of oxide semiconductors with a structure represented by $InMO_3(ZnO)_m$ (m>0), an oxide semiconductor containing gallium (Ga) as M is also referred to as an In—Ga—Zn—O-based oxide semiconductor.

Impurities such as hydrogen, moisture, a hydroxyl group, and hydroxide (also referred to as a hydrogen compound) which act as donors are intentionally eliminated from the oxide semiconductor film 40, and then, oxygen is supplied to the oxide semiconductor film 40 since oxygen is also reduced in the process of eliminating these impurities. Therefore, the oxide semiconductor film 40 is highly purified and electrically i-type (intrinsic). This is in order to suppress the fluctuations of electrical characteristics of the thin film transistor.

The smaller the amount of hydrogen in the oxide semiconductor film 40 is, the closer to i-type the oxide semiconductor film 40 is. Therefore, the concentration of hydrogen contained in the oxide semiconductor film 40 may be $5 \times 10^{19}/cm^3$ or less, preferably $5 \times 10^{18}/cm^3$ or less, more preferably $5 \times 10^{17}/cm^3$ or less, or further more preferably less than $5 \times 10^{16}/cm^3$. The concentration of the hydrogen can be measured by secondary ion mass spectrometry (SIMS).

Hydrogen contained in the oxide semiconductor film 40 is eliminated as much as possible; thus, the carrier density of the oxide semiconductor film 40 is to be less than $5 \times 10^{14}/cm^3$, preferably $5 \times 10^{12}/cm^3$ or less, or more preferably $5 \times 10^{10}/cm^3$ or less. The carrier density of the oxide semiconductor film 40 can be measured in such a manner that a MOS capacitor including the oxide semiconductor film 40 is fabricated, and then, the results of C-V measurement (C-V characteristics) for the MOS capacitor are evaluated.

Additionally, an oxide semiconductor is a wide band gap semiconductor. The band gap of an In—Ga—Zn—O-based oxide semiconductor is 3.15 eV, while the band gap of silicon is 1.12 eV, for example.

In an oxide semiconductor, which is a wide band gap semiconductor, the density of the minority carrier is low and the minority carrier is difficult to be induced. Thus, it can be said that, in the thin film transistor including the oxide semiconductor film 40, tunnel current is difficult to be generated; consequently, off-state current is difficult to flow. Therefore, off-state current per 1-μm channel width of the thin film transistor including the oxide semiconductor film 40 can be 100 aA/μm or less, preferably 10 aA/μm or less, or more preferably 1 aA/μm or less.

Additionally, since an oxide semiconductor is a wide band gap semiconductor, impact ionization and avalanche breakdown are difficult to occur in the thin film transistor including the oxide semiconductor film 40. Therefore, it can be said that the thin film transistor including the oxide semiconductor film 40 has resistance to hot carrier deterioration. This is because hot carrier deterioration is mainly caused by increase in the number of carriers by avalanche breakdown and injection of the carriers accelerated to high speed to the gate insulating film.

The metal film 70 is used as a source electrode or a drain electrode. For the metal film 70, a metal material such as aluminum (Al), chromium (Cr), copper (Cu), tantalum (Ta), titanium (Ti), molybdenum (Mo), or tungsten (W); or an alloy material whose main component is any one of these metal materials can be used. In addition, the metal film 70 may have a structure in which a film of high-melting-point metal formed using chromium (Cr), tantalum (Ta), titanium (Ti), molybdenum (Mo), tungsten (W), or the like is stacked on one side or the both sides of a metal film formed using aluminum (Al), copper (Cu), or the like. Note that aluminum to which an element which prevents hillocks or whiskers which occur in the aluminum film is added is used as a material; thus, the metal film 70 with high heat resistance can be obtained. Examples of the element are silicon (Si), titanium (Ti), tantalum (Ta), tungsten (W), molybdenum (Mo), chromium (Cr), neodymium (Nd), scandium (Sc), yttrium (Y), and the like.

As the metal oxide film 60, a film containing oxide of the metal contained in the metal film 70 can be used. For example, in the case where the metal film 70 is a film containing titanium, a titanium oxide film or the like can be used as the metal oxide film 60.

Further, the oxide semiconductor film 40 is in contact with the metal oxide film 60 and includes a region whose metal concentration is higher than that in any other region in the oxide semiconductor film 40. The region with the higher metal concentration is also referred to as a high metal concentration region 50.

Figure 1B:
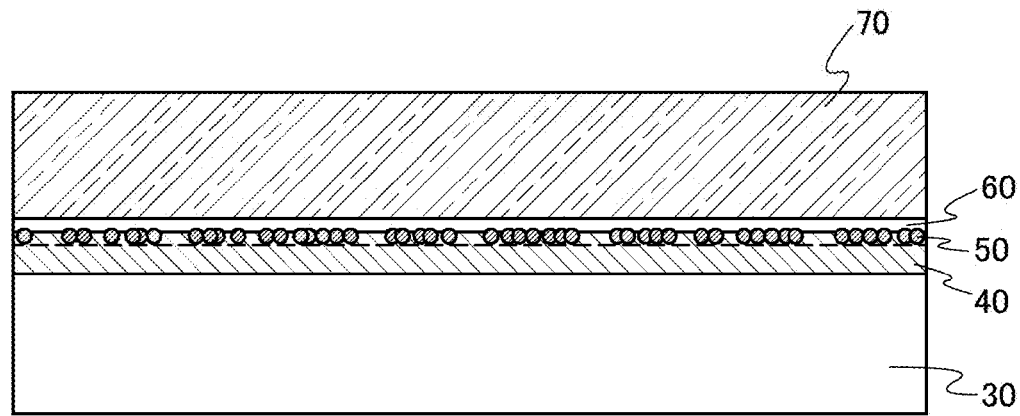

FIG. 1B is an enlarged cross sectional schematic view of a region 100 in FIG. 1(A).

As shown in FIG. 1B, in a high metal concentration region 50, metal contained in the oxide semiconductor film 40 may be present as a crystal grain or a microcrystal.

Figure 2:
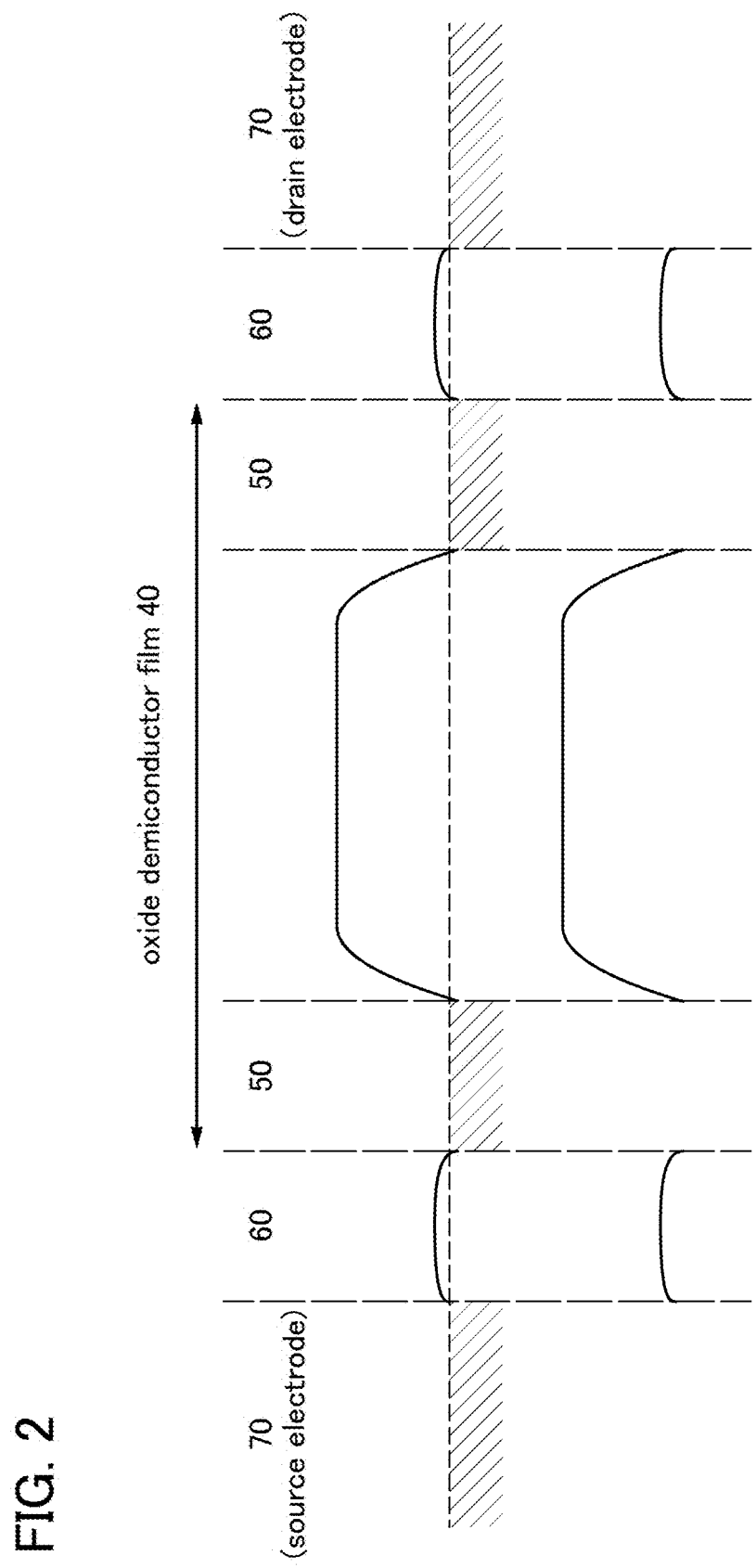
FIG. 2 shows an energy band diagram between a source electrode and a drain electrode of a thin film transistor including an oxide semiconductor.

FIG. 2 is an energy-band diagram (a schematic diagram) between a source electrode and a drain electrode in the thin film transistor with a structure shown in FIGS. 1A and 1B. FIG. 2 illustrates the case where a difference between a potential of a source electrode and a potential of a drain electrode is zero.

Here, the high metal concentration region 50 is dealt as metal. In addition, the impurities are eliminated from the oxide semiconductor film 40 as much as possible and oxygen is supplied to the oxide semiconductor film 40; thus, the oxide semiconductor film 40 is highly purified and electrically i-type (intrinsic). As a result, in the energy-band diagram, Fermi level (Ef) of the inside of the oxide semiconductor film 40 is placed near the middle of the band gap.

From this energy-band diagram, it can be found that there is no barrier at an interface between the high metal concentration region 50 and any other region in the oxide semiconductor film 40 and a favorable contact can be obtained. The same is true of an interface between the high metal concentration region 50 and the metal oxide film 60, and an interface between the metal oxide film 60 and the metal film 70.

Embodiment 2

A process of manufacturing a thin film transistor with a structure shown in FIGS. 1A and 1B will be described.

First, after a conductive film is formed over the substrate 10 having an insulating surface, the gate electrode 20 is formed by a first photolithography step.

A resist mask used in the first photolithography step may be formed by an inkjet method. When a resist mask is formed by an inkjet method, photo masks are not used, so that the manufacturing cost can be reduced.

Next, the gate insulating film 30 is formed over the gate electrode 20.

The gate insulating film 30 is formed by a plasma CVD method, a sputtering method, or the like. As the gate insulating film 30, a film formed using silicon oxide, silicon nitride, silicon oxynitride, silicon nitride oxide, aluminum oxide, aluminum nitride, aluminum oxynitride, aluminum nitride oxide, hafnium oxide, or the like is preferably used.

The gate insulating film 30 in contact with the oxide semiconductor film 40 is required to be a dense film with high withstand voltage. Therefore, a dense film with high withstand voltage which is formed by a high density plasma CVD method using μ wave (2.45 GHz) is especially suitable for the gate insulating film 30.

A property of an interface between the gate insulating film 30 obtained in the above manner, which is a dense film with high withstand voltage, and the oxide semiconductor film 40 which has been i-type in such a manner that the impurities are eliminated therefrom as much as possible and oxygen is supplied thereto is improved.

If a property of the interface between the oxide semiconductor film 40 and the gate insulating film 30 was not preferable, a band between the impurity and a main component of the oxide semiconductor would be broken in a gate bias-temperature stress test (a BT test: 85° C., $2 \times 10^6$ V/cm, 12 hours); as a result, a threshold voltage shift would be caused due to a generated dangling bond.

The gate insulating film 30 may have a stacked structure of a nitride insulating film and an oxide insulating film. For example, the gate insulating film 30 with a stacked structure can be formed in such a manner that a silicon nitride film ($SiN_y$ (y>0)) having a thickness of 50 nm to 200 nm inclusive is formed by a sputtering method as a first gate insulating film, and then a silicon oxide film ($SiO_x$ (x>0)) having a thickness of 5 nm to 300 nm inclusive is formed as a second gate insulating film on the first gate insulating film. The thickness of the gate insulating film 30 may be determined as appropriate depending on a property required for the thin film transistor, and may be approximately 350 nm to 400 nm inclusive.

Preferably, as pretreatment before forming the gate insulating film 30, the substrate 10 provided with the gate electrode 20 may be preheated in a preheating chamber of sputtering apparatus, so that impurities such as hydrogen and moisture absorbed in the substrate 10 are removed and eliminated. This preheating is performed for the reason that the impurities such as hydrogen and moisture are not contained as far as possible in the gate insulating film 30 and the oxide semiconductor film 40 which are subsequently formed. Alternatively, the substrate 10 may be preheated at the time when the gate insulating film 30 is formed thereover.

The appropriate temperature of preheating is 100° C. to 400° C. inclusive. The temperature of 150° C. to 300° C. inclusive is more preferable. Additionally, a cryopump is appropriately used for an exhaustion unit in the preheating chamber.

Next, the oxide semiconductor film 40 is formed on the gate insulating film 30. The appropriate thickness of the oxide semiconductor film 40 is 2 nm to 200 nm inclusive.

The oxide semiconductor film 40 is formed by a sputtering method. The film formation by the sputtering method is performed in a rare gas (typically argon) atmosphere, an oxygen atmosphere, or a mixed atmosphere containing a rare gas and oxygen.

As a target used for forming the oxide semiconductor film 40 by the sputtering method, metal oxide including zinc oxide as a main component can be used. Alternatively, a target for forming an oxide semiconductor containing indium (In), gallium (Ga), and zinc (Zn) having the relative proportion of $In_2O_3:Ga_2O_3:ZnO=1:1:1$ [mol %], or In:Ga:Zn=1:1:0.5 [atom %], In:Ga:Zn=1:1:1 [atom %], or In:Ga:Zn=1:1:2 [atom %] can also be used. In addition, the appropriate fill rate of the target for forming the oxide semiconductor is 90% to 100% inclusive. The fill rate of 95% to 99.9% inclusive is more preferable. This is because a denser oxide semiconductor film can be formed when the target for forming the oxide semiconductor with a high fill rate is used.

Before the oxide semiconductor film 40 is formed, the substrate 10 is placed in a treatment chamber in a reduced pressure state, and the substrate 10 is heated to a temperature higher than or equal to room temperature and lower than 400° C. After that, while residual moisture left in the treatment chamber is eliminated and a sputtering gas from which hydrogen and moisture have been eliminated is introduced to the chamber, voltage is applied between the substrate 10 and the target, so that the oxide semiconductor film 40 is formed over the substrate 10.

It is appropriate that a sorption vacuum pump is used for the exhaustion unit for removing residual moisture left in the treatment chamber. Examples of the pump are a cryopump, an ion pump, a titanium sublimation pump, and the like. Alternatively, a turbo pump provided with a cold trap can be used for the exhaustion unit. From the treatment chamber, a hydrogen atom, a hydrogen molecule, a compound including a hydrogen atom, such as water ($H_2O$), or the like (more preferably, together with a compound including a carbon atom) is eliminated; thus, the concentration of impurities contained in the oxide semiconductor film 40 which is formed in the treatment chamber can be reduced. Additionally, film formation by a sputtering method is performed while residual moisture left in the treatment chamber is eliminated with a cryopump; thus, the temperature of the substrate 10 at the time of forming the oxide semiconductor film 40 can be higher than or equal to room temperature and lower than 400° C.

Note that before the oxide semiconductor film 40 is formed by a sputtering method, dust on a surface of the gate insulating film 30 may be preferably removed by reverse sputtering. The reverse sputtering refers to a method in which a substrate surface is cleaned with reactive plasma generated by voltage application to the substrate side using an RF power source without voltage application to a target side. Note that the reverse sputtering is performed in an argon atmosphere. Alternatively, nitrogen, helium, oxygen, or the like may be used instead of argon.

After the oxide semiconductor film 40 is formed, the oxide semiconductor film 40 is subjected to dehydration or dehydrogenation. It is appropriate that the heat treatment for dehydration or dehydrogenation is performed at 400° C. to 750° C. inclusive; in particular, the preferable temperature is 425° C. or higher. Note that although the heat treatment may be performed for one hour or less when the treatment is performed at 425° C. or higher, the heat treatment is preferably performed for more than one hour when the treatment is performed at lower than 425° C. In this specification, "dehydrogenation" does not indicate only elimination of a hydrogen molecule ($H_2$) by this heat treatment. For convenience, elimination of a hydrogen atom (H), a hydroxy group (OH), and the like is also referred to as "dehydration or dehydrogenation."

For example, the substrate 10 which is provided with the oxide semiconductor film 40 is put in an electric furnace which is a kind of heat treatment apparatus and heat treatment is performed in a nitrogen atmosphere. After that, a high-purity oxygen gas, a high-purity dinitrogen monoxide ($N_2O$) gas, or an ultra-dry air (a mixed gas of nitrogen and oxygen at the ratio of nitrogen to oxygen, which is 4:1, having a dew point of lower than or equal to −40° C., preferably lower than or equal to −60° C.) is introduced into the same furnace and cooling is performed. It is preferable that water, hydrogen, and the like be not included in the oxygen gas or the dinitrogen monoxide ($N_2O$) gas. In addition, it is appropriate that the purity of an oxygen gas or a dinitrogen monoxide ($N_2O$) gas is 6N (99.9999%) or more preferably 7N (99.99999%) or more (i.e., the concentration of the impurities in the oxygen gas or the dinitrogen monoxide ($N_2O$) gas is 1 ppm or less, more preferably 0.1 ppm or less).

Note that the heat treatment apparatus is not limited to the electric furnace, and an RTA (rapid thermal annealing) apparatus such as a GRTA (gas rapid thermal annealing) apparatus or an LRTA (lamp rapid thermal annealing) apparatus can be used, for example.

In addition, heat treatment for the dehydration or dehydrogenation of the oxide semiconductor film 40 can be performed for the oxide semiconductor film 40 before or after the oxide semiconductor film 40 is processed into an island shape in a second photolithography step.

Through the above processes, the entire region of the oxide semiconductor film 40 is in an oxygen-excess state, and thus the entire region of the oxide semiconductor film 40 has high resistance and is i-type.

Next, the metal film 70 is stacked over the gate insulating film 30 and on the oxide semiconductor film 40. The metal film 70 may be formed by a sputtering method, a vacuum evaporation method, or the like. In addition, the metal film 70 may have a single layer structure or a stacked structure of two or more layers.

After that, a resist mask is formed over the metal film 70 by a third photolithography step. The resist mask is selectively etched, so that a source electrode and a drain electrode are formed. Then, the resist mask is removed.

The channel length of the thin film transistor is determined depending on the distance between a bottom edge of the source electrode and a bottom edge of the drain electrode which are adjacent to each other over the oxide semiconductor film 40. That is, it can be said that the channel length of the thin film transistor is determined depending on the conditions of the light exposure whereby the resist mask is formed in the third photolithography process. For the light exposure for forming the resist mask in the third photolithography process, ultraviolet, KrF laser, or ArF laser can be used. In addition, in the case where the cannel length is shorter than 25 nm, the light exposure may be performed with extreme ultraviolet, whose wave length is extremely short, that is, several nanometers to several tens nanometers inclusive. This is because the light exposure with extreme ultraviolet can provide a high resolution and a large focus depth. Therefore, the channel length of the thin film transistor can be 10 nm to 1000 nm inclusive depending on the kind of light used for the light exposure.

Note that materials for the metal film 70 and materials for the oxide semiconductor film 40, and etching conditions need to be adjusted as appropriate so that the oxide semiconductor film 40 is not removed when the metal film 70 is etched.

For example, when a titanium film is used as the metal film 70 and an In—Ga—Zn—O-based oxide semiconductor film is used as the oxide semiconductor film 40, an ammonia hydrogen peroxide solution (a mixture liquid of ammonia, water, and a hydrogen peroxide solution) may be used as an etchant.

Note that it is acceptable that the oxide semiconductor film 40 has a groove (a depression portion) by being etched only partly in the third photolithography step. The resist mask used for forming the source electrode and the drain electrode may be formed by an inkjet method. When a resist mask is formed by an inkjet method, photo masks are not used; therefore, the manufacturing cost can be reduced.

Water (absorbed water) or the like on a surface of the oxide semiconductor film 40 which is not covered may be eliminated by plasma treatment with a gas such as dinitrogen monoxide ($N_2O$), nitrogen ($N_2$), or argon (Ar) after the source electrode and the drain electrode are formed. In the plasma treatment, a mixed gas of oxygen and argon can also be used.

In the case where the plasma treatment is performed, the insulating film 80 which is in contact with part of the oxide semiconductor film 40 is formed without exposing the oxide semiconductor film 40 to air. In the thin film transistor shown in FIG. 1A, the oxide semiconductor film 40 is in contact with the insulating film 80 at the portion of the oxide semiconductor film 40 which is not covered with the metal film 70.

As an example of the insulating film 80, a silicon oxide film having defects is given. The silicon oxide film is formed in the following manner: the substrate 10 which is provided with the oxide semiconductor film 40 and the metal film 70 is heated at a temperature higher than or equal to room temperature and lower than 100° C.; a sputtering gas containing high-purity oxygen from which hydrogen and moisture have been eliminated is introduced; and a silicon target is used.

The insulating film 80 is preferably formed while residual moisture left in the treatment chamber is eliminated. This is in order to prevent the oxide semiconductor film 40 and the insulating film 80 from containing hydrogen, hydroxy group, and moisture.

It is appropriate that a sorption vacuum pump is used for the exhaustion unit for eliminating residual moisture from the treatment chamber. Examples of the pump are a cryopump, an ion pump, a titanium sublimation pump, and the like. Alternatively, a turbo pump provided with a cold trap can be used for the exhaustion unit. From the treatment chamber, a hydrogen atom, a hydrogen molecule, a compound including a hydrogen atom, such as water ($H_2O$), and the like are eliminated; thus, the concentration of impurities contained in the insulating film 80 which is formed in the treatment chamber can be reduced.

Note that as the insulating film 80, a silicon oxynitride film, an aluminum oxide film, or an aluminum oxynitride film in addition to a silicon oxide film can be used.

After the insulating film 80 is formed, heat treatment is performed under an atmosphere of an inert gas or an atmosphere of a nitrogen gas at a temperature of 100° C. to 400° C. inclusive, or preferably at a temperature higher than or equal to 150° C. and lower than 350° C. Once the heat treatment is performed, the impurities such as hydrogen, moisture, hydroxy group, and hydride contained in the oxide semiconductor film 40 is diffused into the insulating film 80 having defects. As a result, the impurities contained in the oxide semiconductor film 40 can be further reduced.

In addition, by the heat treatment, the metal oxide film 60 is formed at the interface between the oxide semiconductor film 40 and the metal film 70 and the high metal concentration region 50 is formed at a region in the oxide semiconductor film 40 which is in contact with the metal oxide film 60.

Note that the metal oxide film 60 may be formed on the oxide semiconductor film 40 by a sputtering method before the metal film 70 is formed. In this case, the thin film transistor shown in FIGS. 1A and 1B is obtained in such a manner that the metal oxide film 60 is removed from the region on the oxide semiconductor film 40 which is not to be covered with the metal film 70 after the metal oxide film 60 is formed on the oxide semiconductor film 40.

Further, the above heat treatment may be performed before the insulating film 80 is formed.

Through the above process, the thin film transistor with a structure shown in FIGS. 1A and 1B can be formed.

Embodiment 3

Phenomena, in the thin film transistor with a structure shown in FIGS. 1A and 1B, where the metal oxide film 60 is formed at the interface between the oxide semiconductor film 40 and the metal film 70 and the high metal concentration region 50 is formed at a region in the oxide semiconductor film 40 which is in contact with the metal oxide film 60 were examined by computational science, and the results will be described.

In the following calculation, the case where the oxide semiconductor film 40 is an In—Ga—Zn—O-based oxide semiconductor film was considered. In addition, the case where the metal film 70 is a tungsten (W) film, a molybdenum (Mo) film, or a titanium (Ti) film was considered.

[Phenomenon in which the High Metal Concentration Region 50 is Formed]

Energy which is necessary for oxide of each of indium, gallium, and zinc contained in an In—Ga—Zn—O-based oxide semiconductor to form an oxygen-deficient state (deficiency formation energy $E_{def}$) was calculated.

The deficiency formation energy $E_{def}$ is defined by Formula 1 shown as follows.

[Formula 1]

$$E_{def}=E(A_mO_{n-1})+E(O)-E(A_mO_n) \quad (1)$$

Note that $E(A_mO_{n-1})$ represents energy of oxide with oxygen deficiency $A_mO_{n-1}$, $E(O)$ represents energy of an oxygen atom, and $E(A_mO_n)$ represents energy of oxide without oxygen deficiency $A_mO_n$. In addition, A represents one of the following: indium; gallium; zinc; or a combination of indium, gallium, and zinc.

Additionally, a relation between a concentration of oxygen deficiency n and the deficiency formation energy $E_{def}$ is approximately represented by Formula 2 shown as follows.

[Formula 2]

$$n = N \exp\left(-\frac{E_{def}}{k_B T}\right) \quad (2)$$

Note that N represents the number of oxygen atoms in a state where deficiency is not formed, $k_B$ represents Boltzmann constant, and T represents absolute temperature.

From Formula 2, it was found that when the deficiency formation energy $E_{def}$ is increased, the concentration of oxygen deficiency n, that is, the amount of oxygen deficiency is decreased.

For the calculation of the deficiency formation energy $E_{def}$, CASTEP, which is a calculation program for a density functional theory, was used. A plane-wave-basis pseudopotential method was used as the density functional theory, and GGA-PBE was used for a functional. The cut-off energy was set to 500 eV. The number of grids at k point was set as follows: 3×3×1 for oxide containing indium, gallium, and zinc (hereinafter, also referred to as IGZO); 2×2×2 for indium oxide (hereinafter, also referred to as $In_2O_3$); 2×3×2 for gallium oxide (hereinafter, also referred to as $Ga_2O_3$); and 4×4×1 for zinc oxide (hereinafter, also referred to as ZnO).

As a crystal structure of IGZO, a structure where 84 atoms obtained by doubling a structure of a symmetry R-3 (international number: 148) both in the a-axis direction and in the b-axis direction were arranged so that energy of Ga and Zn was minimized was employed. Crystal structures of $In_2O_3$, $Ga_2O_3$, and ZnO were a bixbyite structure of 80 atoms, a β-gallia structure of 80 atoms, and an wurtzite structure of 80 atoms, respectively.

Table 1 shows values of the deficiency formation energy $E_{def}$ in the cases where A in Formula 1 is indium; gallium;

zinc; and a combination of indium, gallium, and zinc. Additionally, FIGS. 3A to 3C show crystal structures of metal and oxygen in the In—Ga—Zn— O-based oxide semiconductor.

TABLE 1

| Compound | $E_{def}$(eV) |
|---|---|
| $In_2O_3$ | 3.06 |
| ZnO | 3.75 |
| IGZO (Model 1) | 3.73 |
| IGZO (Model 2) | 3.98 |
| IGZO (Model 3) | 4.08 |
| $Ga_2O_3$ | 4.18 |

Figure 3A:
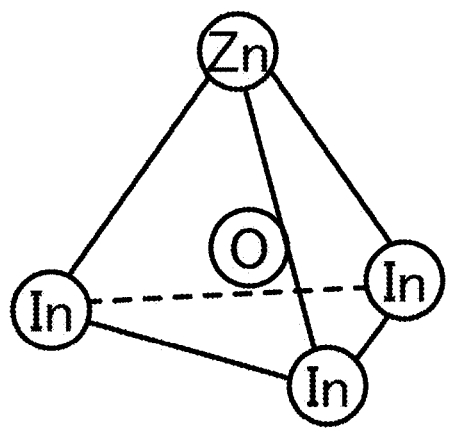
FIGS. 3A to 3C show crystal structures of metal and oxygen in an In—Ga—Zn—O-based oxide semiconductor.
Figure 3B:
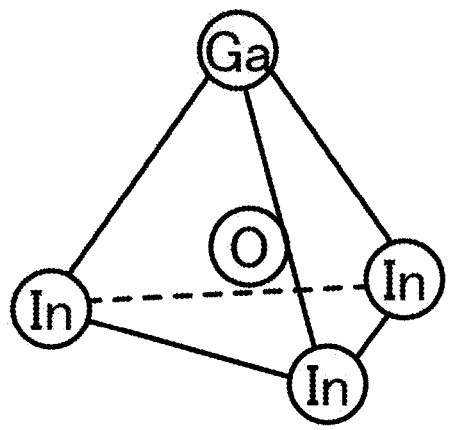
Figure 3C:
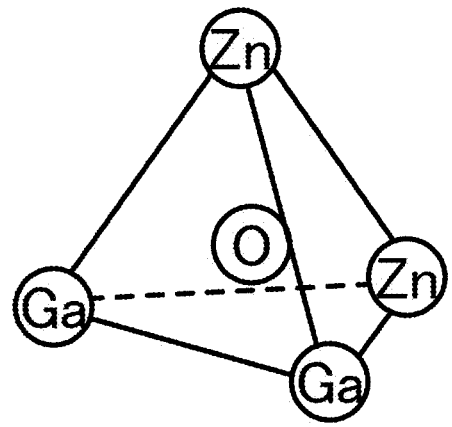

The value of the deficiency formation energy $E_{def}$ of IGZO (Model 1) corresponds to the deficiency formation energy of oxygen adjacent to three indium atoms and one zinc atom in an IGZO crystal in the case where A is a combination of indium, gallium, and zinc (see FIG. 3A).

The value of the deficiency formation energy $E_{def}$ of IGZO (Model 2) corresponds to the deficiency formation energy of oxygen adjacent to three indium atoms and one gallium atom in an IGZO crystal in the case where A is a combination of indium, gallium, and zinc (see FIG. 3B).

The value of the deficiency formation energy $E_{def}$ of IGZO (Model 3) corresponds to the deficiency formation energy of oxygen adjacent to two zinc atoms and two gallium atoms in an IGZO crystal in the case where A is a combination of indium, gallium, and zinc (see FIG. 3C).

The larger the value of the deficiency formation energy $E_{def}$ is, the more energy is needed for formation of an oxygen-deficient state. That is, it was suggested that the larger the value of the deficiency formation energy $E_{def}$ is, the stronger the bond between oxygen and metal tends to be. In other words, from Table 1, it could be said that indium, whose value of the deficiency formation energy $E_{def}$ was the lowest, had the weakest bond with oxygen.

An oxygen-deficient state in an In—Ga—Zn—O-based oxide semiconductor was formed because the metal film 70 used for a source electrode or a drain electrode extracts oxygen from the oxide semiconductor film 40. Part of the oxide semiconductor film 40 which was thus brought into an oxygen-deficient state became the high metal concentration region 50. The carrier density of the oxide semiconductor film 40 varies at least by two digits depending on the presence of this high metal concentration region 50. This is because oxygen was extracted from the oxide semiconductor film 40, and the oxide semiconductor film 40 thus became n-type. Note that to be n-type means to be in a state where the number of electrons which are majority carriers increases.

[Phenomenon in which the Metal Oxide Film 60 is Formed]

Quantum molecular dynamic (QMD) simulation was performed on a stacked structure of the oxide semiconductor film 40 using the In—Ga—Zn—O-based oxide semiconductor and the metal film 70. This is in order to confirm extraction of oxygen from the oxide semiconductor by metal.

A structure for the calculation was manufactured in the following manner. First, structural optimization using a QMD method was performed on an amorphous In—Ga—Zn—O-based oxide semiconductor (hereinafter, also referred to as a-IGZO) formed by a classical molecular dynamic (CMD) method. Further, by cutting the structure-optimized unit cell, a-IGZO films were obtained. On the a-IGZO films, metal films having crystals of respective metal atoms (W, Mo, and Ti) were stacked. After that, the manufactured structures were structurally optimized. Each of these structures was used as a starting object, and calculation was performed using the QMD method at 623.0 K. Note that the lower end of each of the a-IGZO films and the top end of each of the metal films were fixed so that only interaction at the interface could be estimated.

Calculation conditions for the CMD calculation are shown below. Materials Explorer was used for a calculation program. The a-IGZO was formed under the following conditions. The all 84 atoms were arranged at random in a simulation cell with a side of 1 nm at a ratio of In:Ga:Zn:O=1:1:1:4, and the density was set to 5.9 g/cm$^3$. The CMD calculation was performed with an NVT ensemble, and the temperature was gradually lowered from 5500 K to 1 K. After that, structural relaxation was performed at 1 K for 10 ns. The total calculation time was 10 ns with time intervals of 0.1 fs. As for potentials, a Born-Mayer-Huggins potential was applied to a metal-oxygen bond and an oxygen-oxygen bond, and a Lennard-Jones potential was applied to a metal-metal bond. Charges were set as follows: +3 for In, +3 for Ga, +2 for Zn, and −2 for O.

Calculation conditions for the QMD calculation are shown below. A first principle calculation software, CASTEP, was used for a calculation program. GGA-PBE was used for a functional. Ultrasoft was used for a pseudopotential. The cut-off energy was set to 260 eV, and the k-point was set to 1×1×1. The QMD calculation was performed with the NVT ensemble, and the temperature was 623 K. The total calculation time was 2.0 ps with time intervals of 1.0 fs.

The results of the above calculations are described with reference to structural models shown in FIGS. 4A and 4B, FIGS. 5A and 5B, and FIGS. 6A and 6B. In FIGS. 4A and 4B, FIGS. 5A and 5B, and FIGS. 6A and 6B, a white sphere represents a crystalline metal atom contained in a metal film stacked on the a-IGZO film, and a black sphere represents an oxygen atom.

Figure 4A:
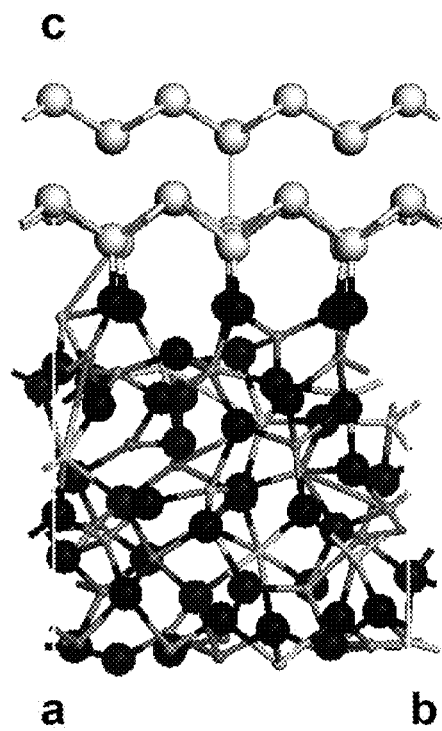
FIGS. 4A and 4B show diagrams each illustrating a structural model.
Figure 4B:
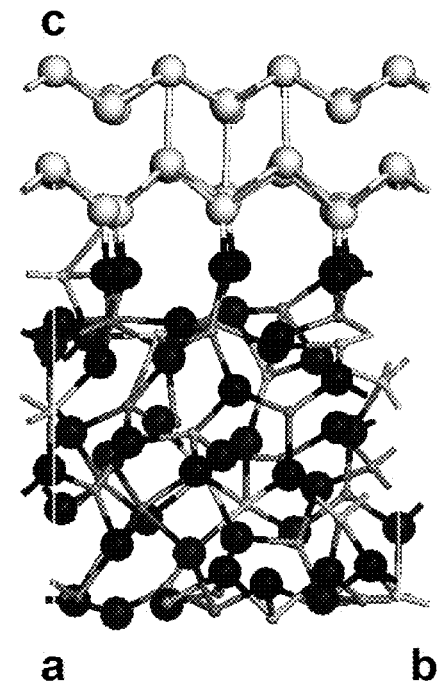

FIGS. 4A and 4B show structural models in which a metal film containing a crystal of tungsten (W) was stacked on the a-IGZO film. FIG. 4A corresponds to the structure before the QMD calculation, and FIG. 4B corresponds to the structure after the QMD calculation.

Figure 5A:
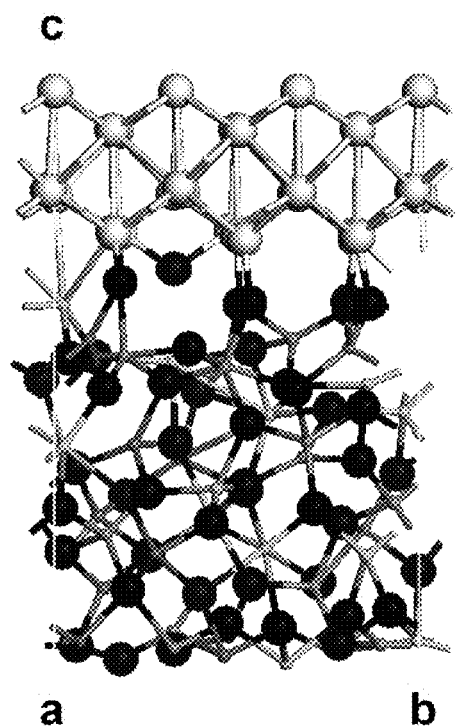
FIGS. 5A and 5B show diagrams each illustrating a structural model.
Figure 5B:
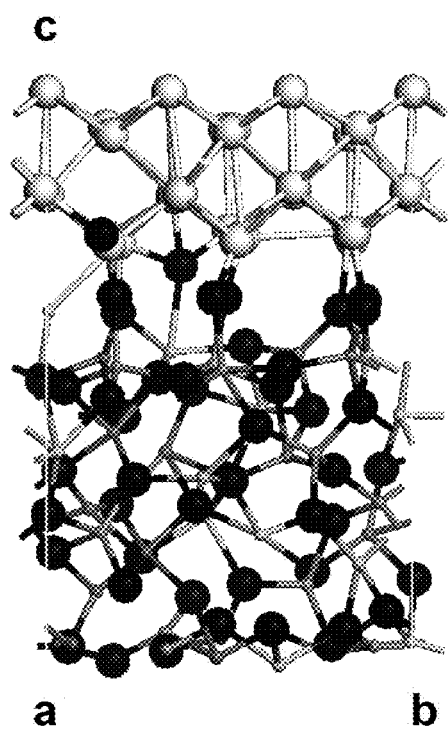

FIGS. 5A and 5B show structural models in which a metal film containing a crystal of molybdenum (Mo) was stacked on the a-IGZO film. FIG. 5A corresponds to the structure before the QMD calculation, and FIG. 5B corresponds to the structure after the QMD calculation.

Figure 6A:
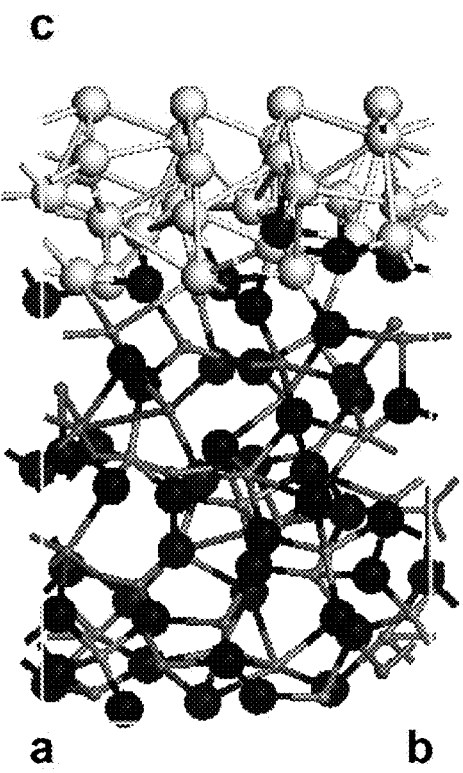
FIGS. 6A and 6B show diagrams each illustrating a structural model.
Figure 6B:
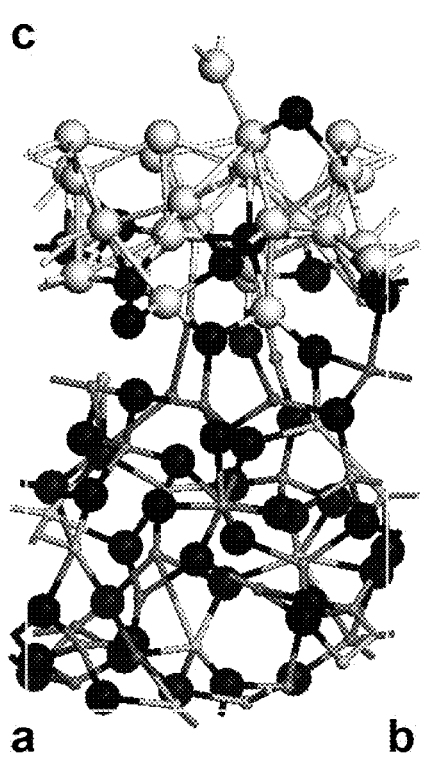

FIGS. 6A and 6B show structural models in which a metal film containing a crystal of titanium (Ti) was stacked on the a-IGZO film. FIG. 6A corresponds to the structure before the QMD calculation, and FIG. 6B corresponds to the structure after the QMD calculation.

From FIG. 5A and FIG. 6A, it could be found that oxygen atoms have already moved to the metal film before the structural optimization is performed in the case where a metal film containing a crystal of molybdenum or titanium is stacked on the a-IGZO film. In addition, from the comparison among FIG. 4B, FIG. 5B, and FIG. 6B, it could be found that the largest number of oxygen atoms move to the metal film in the case where a metal film containing a crystal of titanium is stacked on the a-IGZO film. Therefore, when titanium was used as the metal, oxygen was extracted from an oxide semiconductor by metal the most frequently. The results indicated that a metal film containing a titanium crystal was the most optimal as an electrode leading to the oxygen deficiency in the a-IGZO film.

[Carrier Density of Oxide Semiconductor Film 40]

The fact that the metal contained in the metal film 70 extracts oxygen from the oxide semiconductor film 40 was evaluated by actually fabricating an element. Specifically, the carrier density of the oxide semiconductor film 40 was calculated both in the case where the metal film capable of extracting oxygen was stacked on the oxide semiconductor film and in the case where the metal film incapable of extracting oxygen was stacked on the oxide semiconductor film; then, the results were compared.

The carrier density of the oxide semiconductor film can be obtained in such a manner that an MOS capacitor including an oxide semiconductor film is fabricated and the results of the C-V measurement (the C-V characteristics) for the MOS capacitor are evaluated.

The carrier density was measured in the following steps 1 to 3: (1) to obtain a C-V characteristics diagram on which the relation between the gate voltage (Vg) and capacitance (C) of the MOS capacitor are plotted; (2) to obtain a graph showing the relation between the gate voltage (Vg) and $(1/C)^2$ with the use of the C-V characteristics, and to determine the differential value of $(1/C)^2$ in a weak inversion region in the graph; and (3) to substitute the determined differential value into Formula 3, which is shown below, representing the carrier density (Nd).

[Formula 3]

$$N_d = -\left(\frac{2}{e\varepsilon_0\varepsilon}\right) / \frac{d(1/C)^2}{dV} \quad (3)$$

Note that e represents an electrical element amount, a represents vacuum dielectric constant, and $\in$ represents relative dielectric constant of an oxide semiconductor.

As samples for the measurement, an MOS capacitor including a metal film capable of extracting oxygen (hereinafter, also referred to as Sample 1), and an MOS capacitor including a metal film incapable of extracting oxygen (hereinafter, also referred to as Sample 2) were prepared. Note that a titanium film was used for the metal film that is effective in extracting oxygen. As the metal film that is not effective in extracting oxygen, a film including a titanium film and a titanium nitride film provided on the surface of the titanium film (on the oxide semiconductor side) was used.

The details of the samples are as follows: Sample 1 includes a titanium film of 400 nm in thickness over a glass substrate, an oxide semiconductor film of 2 μm in thickness including an amorphous In—Ga—Zn—O-based oxide semiconductor (a-IGZO) on the titanium film, a silicon oxynitride film of 300 nm in thickness on the oxide semiconductor film, and a silver film of 300 nm in thickness on the silicon oxynitride film; and Sample 2, a titanium film of 300 nm in thickness over a glass substrate, a titanium nitride film of 100 nm in thickness on the titanium film, an oxide semiconductor film of 2 μm in thickness including an amorphous In—Ga—Zn—O-based oxide semiconductor (a-IGZO) on the titanium nitride film, a silicon oxynitride film of 300 nm in thickness on the oxide semiconductor film, and a silver film of 300 nm in thickness on the silicon oxynitride film.

Note that the oxide semiconductor films included in Sample 1 and Sample 2 were formed by a sputtering method using a target for forming the oxide semiconductor film containing indium (In), gallium (Ga), and zinc (Zn) (In:Ga:Zn=1:1:0.5 [atom %]). In addition, the atmosphere for forming the oxide semiconductor films was a mixed atmosphere of argon (Ar) and oxygen ($O_2$) (Ar:$O_2$=30 (sccm):15 (sccm)).

Figure 7A:
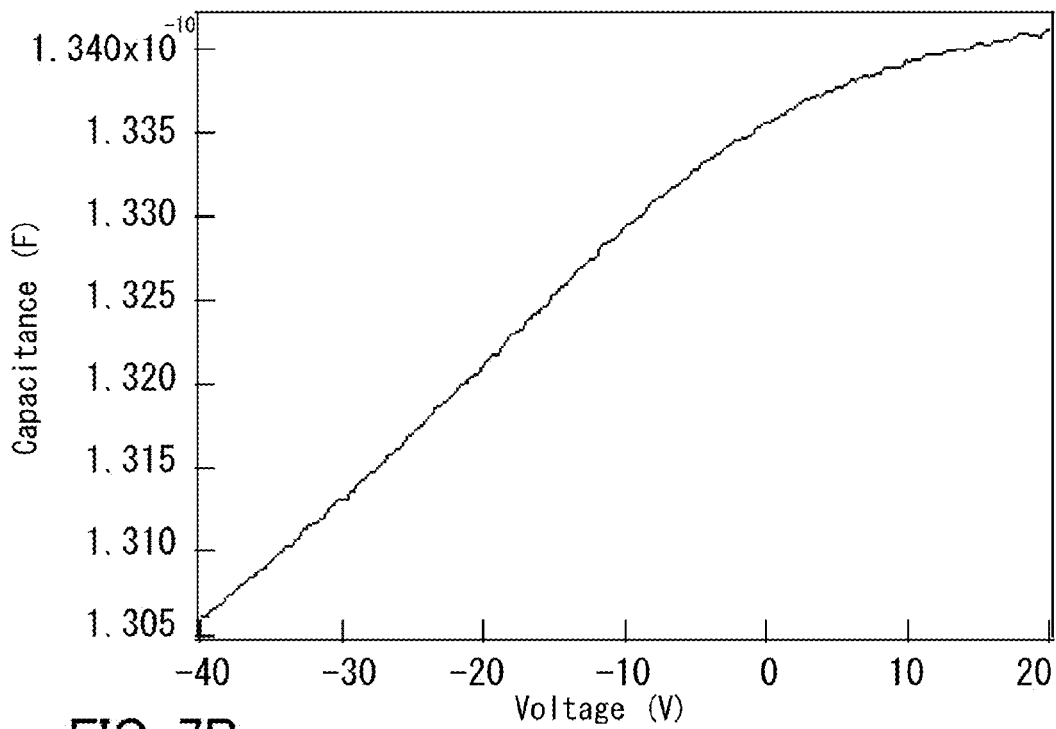
FIG. 7A shows a graph illustrating C-V characteristics of Sample 1.
Figure 7B:
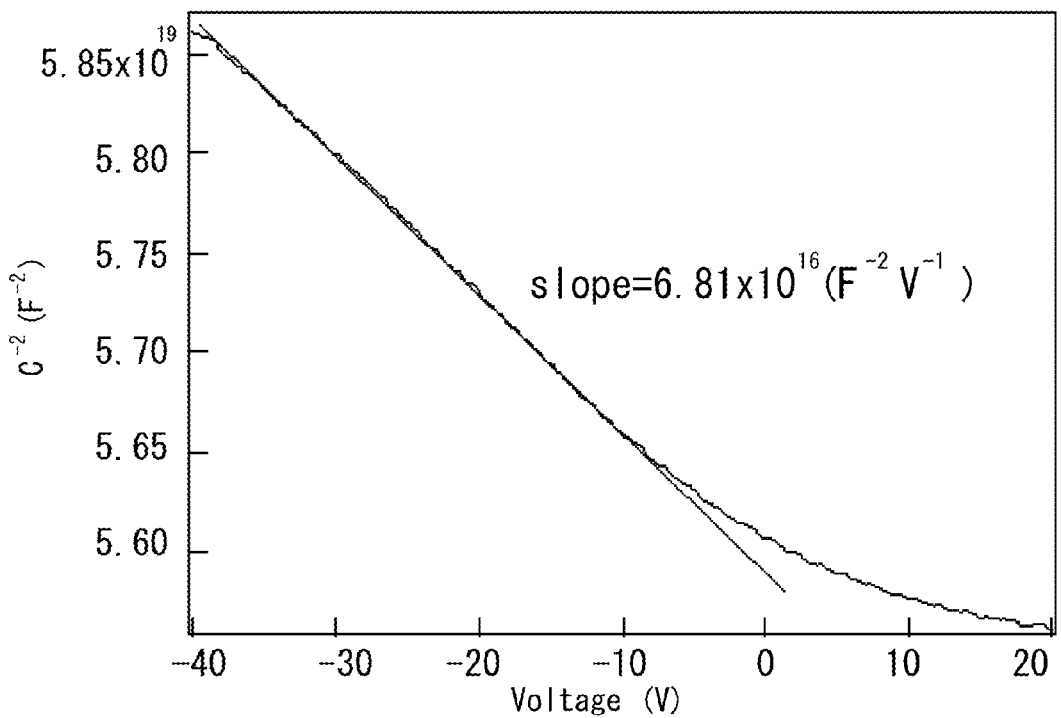
FIG. 7B shows a graph illustrating a relation between gate voltage (Vg) and $(1/C)^2$ of Sample 1.

FIG. 7A shows the C-V characteristics of Sample 1. In addition, FIG. 7B shows the relation between the gate voltage (Vg) and $(1/C)^2$ of Sample 1. The differential value of $(1/C)^2$ in a weak inversion region in FIG. 7B was substituted into Formula 3; thus, the carrier density of the oxide semiconductor film was determined to be $1.8 \times 10^{12}/cm^3$.

Figure 8A:
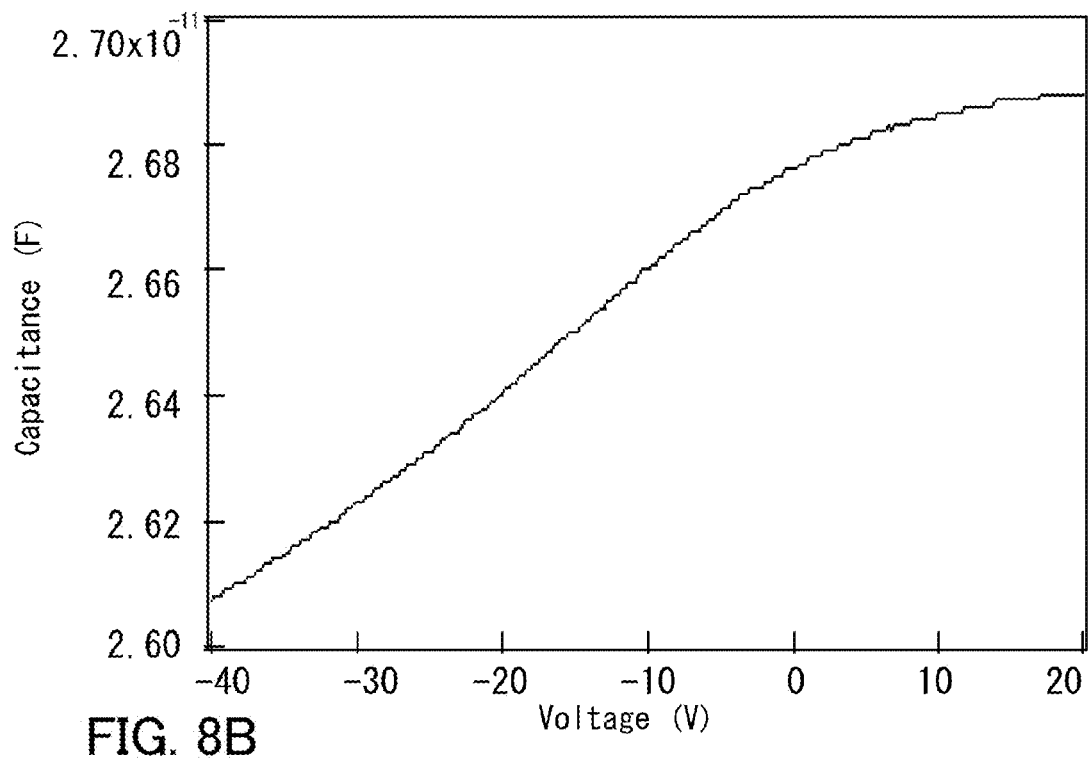
FIG. 8A shows a graph illustrating C-V characteristics of Sample 2.
Figure 8B:
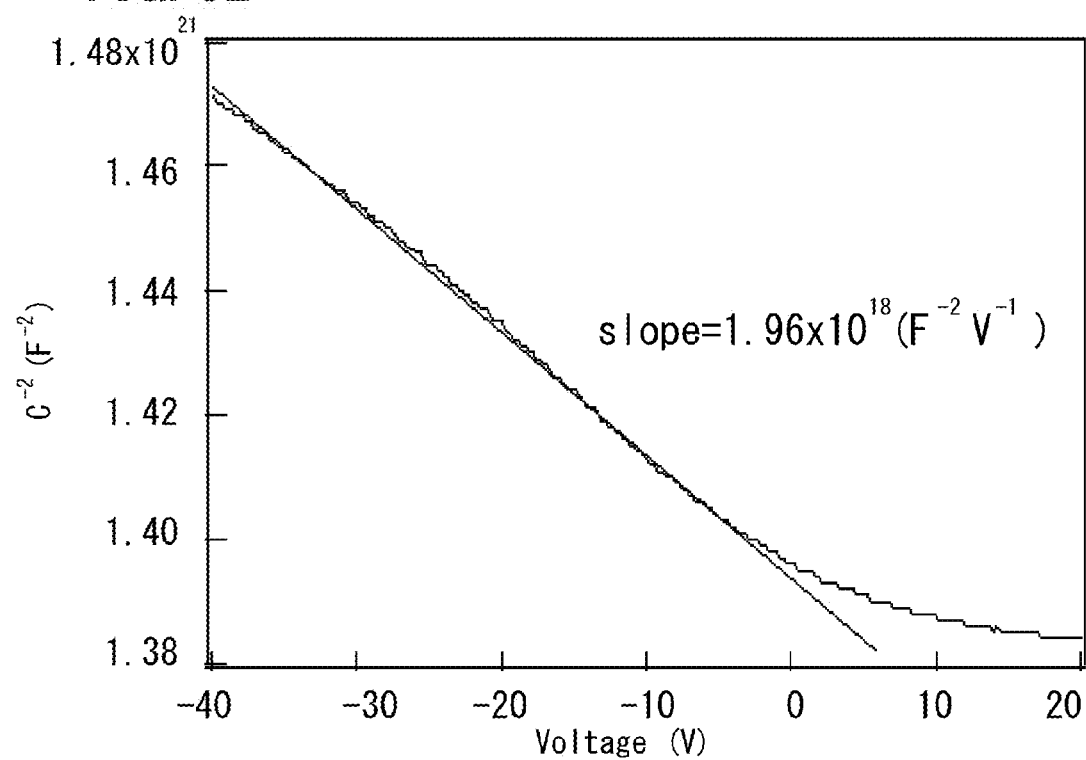
FIG. 8B shows a graph illustrating a relation between gate voltage (Vg) and $(1/C)^2$ of Sample 2.

FIG. 8A shows the C-V characteristics of Sample 2. In addition, FIG. 8B shows the relation between the gate voltage (Vg) and $(1/C)^2$ of Sample 2. The differential value of $(1/C)^2$ in a weak inversion region in FIG. 8B was substituted into Formula 3; thus, the carrier density of the oxide semiconductor film was determined to be $6.0 \times 10^{10}/cm^3$.

From the above results, it was found that the values of the carrier density of the oxide semiconductor film shift by two digits from each other in the case of the MOS capacitor including a metal film capable of extracting oxygen (Sample 1), and the MOS capacitor including a metal film incapable of extracting oxygen (Sample 2). This suggested that oxygen was extracted from the oxide semiconductor film by the metal film and the oxygen deficiency increased in the oxide semiconductor film; thus, the oxide semiconductor film in contact with the metal film became n-type. Note that to be n-type means to be in a state where the number of electrons which are majority carriers increases.

[Conductivity of Titanium Oxide Film]

Taking into consideration the above calculation results, the case where the metal film 70 is a metal film containing a titanium crystal in the thin film transistor shown in FIGS. 1A and 1B was considered.

At the interface between the In—Ga—Zn—O-based oxide semiconductor film (corresponding to the oxide semiconductor film 40 in FIGS. 1A and 1B) and a titanium film (corresponding to the metal film 70 in FIGS. 1A and 1B), oxygen which is extracted by titanium reacts titanium; thus, a titanium oxide film (corresponding to the metal oxide film 60 in FIGS. 1A and 1B) was formed. Next, the verification results of the conductivity of this titanium oxide film obtained by computational science are shown.

Titanium dioxide had several crystal structures such as a rutile structure (high temperature tetragonal crystal), an anatase structure (low temperature tetragonal crystal), and a brookite structure (orthorhombic crystal). Since both the anatase structure and the brookite structure are, by being heated, irreversibly changed into the rutile structure, which is the most stable structure, the above titanium dioxide was assumed to have the rutile structure.

Figure 9:
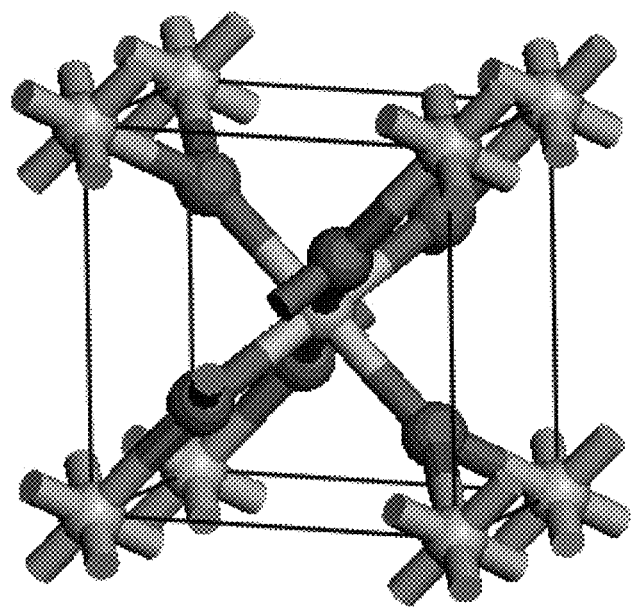
FIG. 9 shows a crystal structure of titanium dioxide having a rutile structure.

FIG. 9 shows a crystal structure of titanium dioxide having a rutile structure. The rutile structure is a tetragonal crystal and belongs to the space group, which is a description of the symmetry of the crystal, of P42/mnm. Note that titanium dioxide having an anatase structure also belongs to the space group, which is a description of the symmetry of the crystal, of P42/mnm like the titanium dioxide having the rutile structure.

Simulation for obtaining a state density was performed on the above crystal structure of titanium dioxide by a density functional theory using a GGA-PBE functional. With symmetry maintained, the structure including the cell structure was optimized and the state density was calculated. For calculation by a density functional theory, a plane wave pseudopotential method using the CASTEP code was used. The cut-off energy was set to 380 eV.

Figure 10:
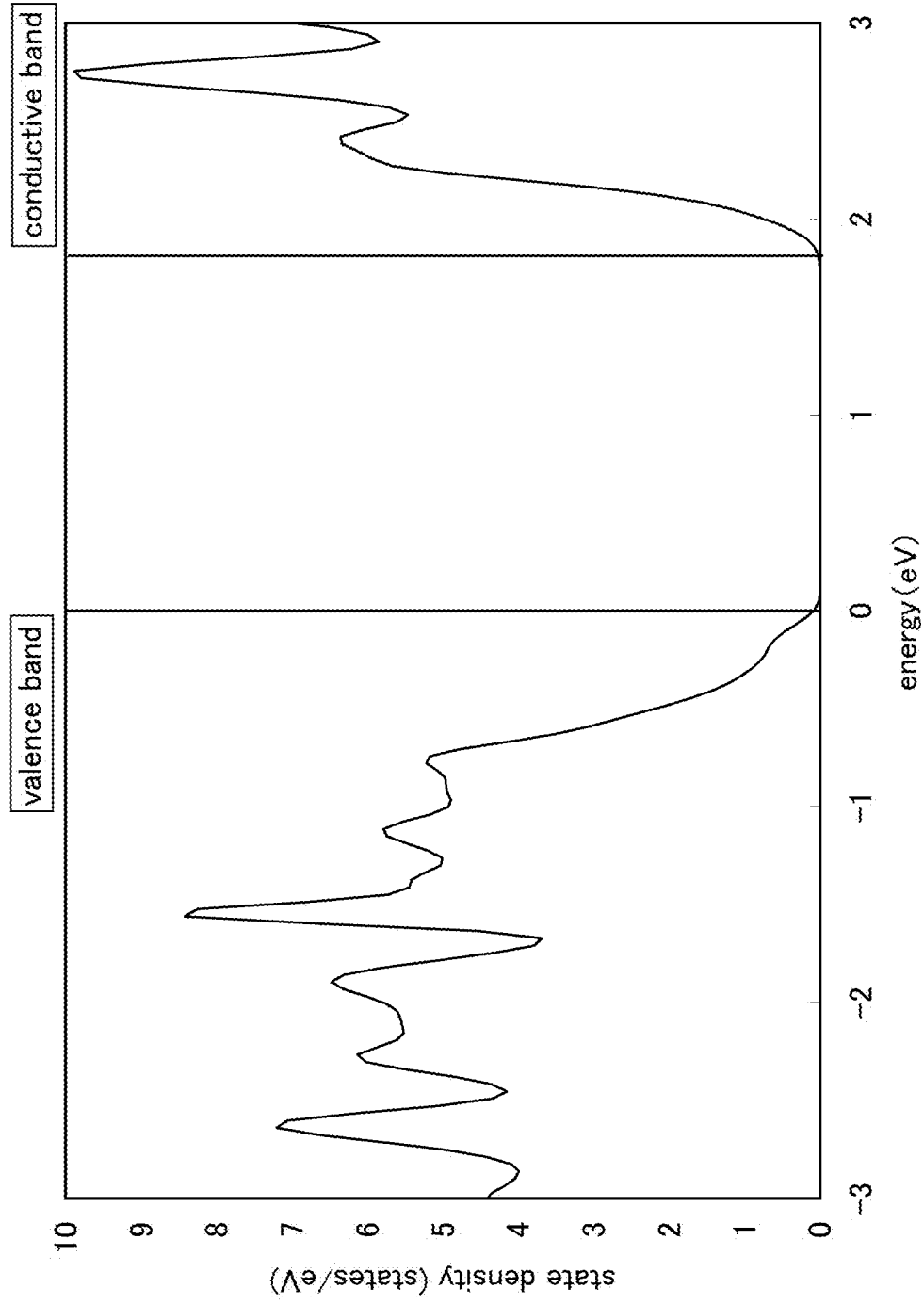
FIG. 10 shows a state density of titanium dioxide having a rutile structure.

FIG. 10 shows a state density of titanium dioxide having a rutile structure. From FIG. 10, it was found that titanium dioxide having the rutile structure has a band gap, and that it has a state density similar to that of a semiconductor. Note that, in the density functional theory, the band gap tends to be estimated small; therefore, the actual band gap of titanium dioxide is approximately 3.0 eV, which is larger than the band gap shown in the state density shown by FIG. 10. Note that since calculation of electron state using a density functional theory was performed at absolute zero; therefore, an origin of energy is Fermi level.

Figure 11:
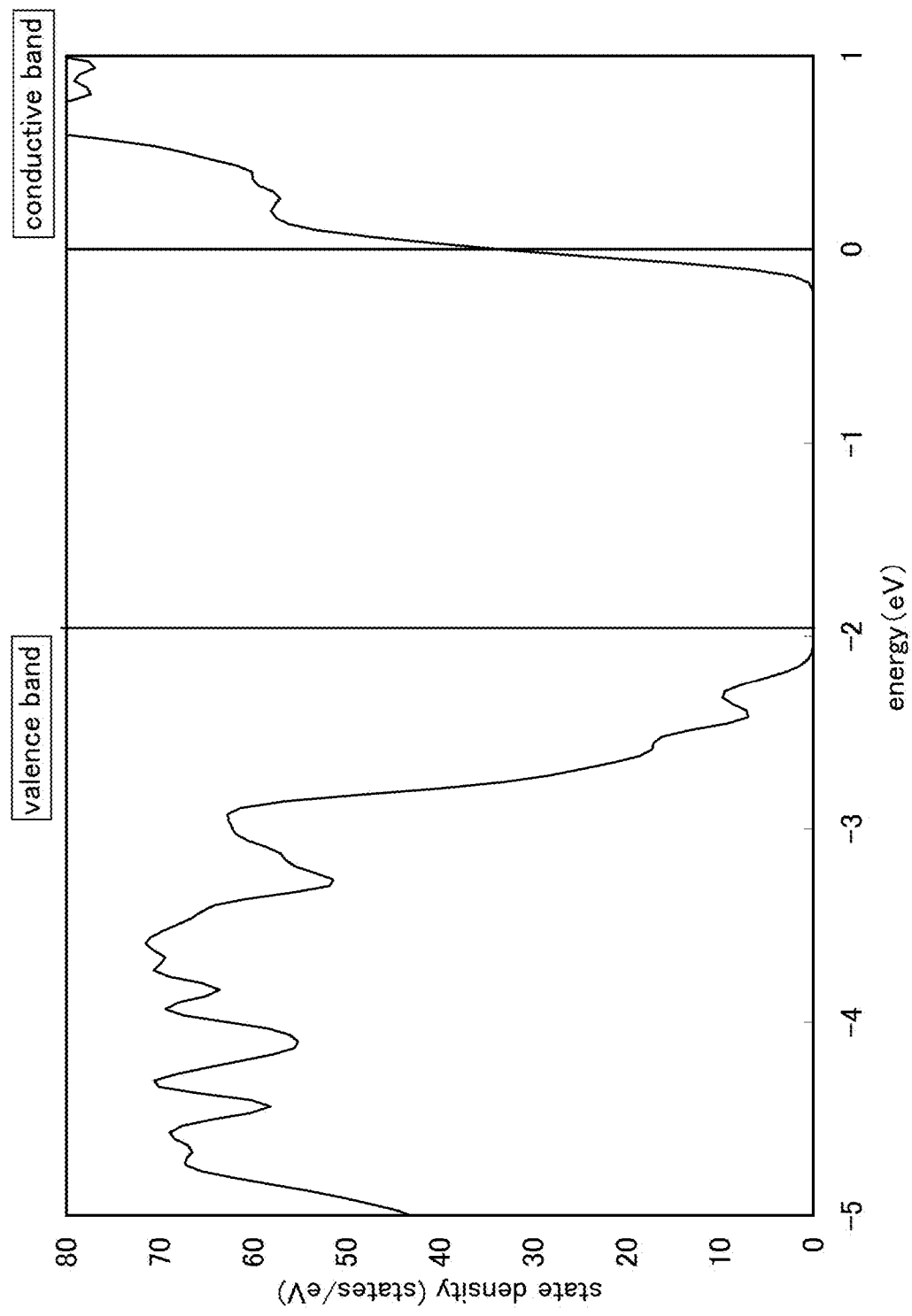
FIG. 11 shows a state density of titanium dioxide having a rutile structure in an oxygen-deficient state.

FIG. 11 shows a state density of titanium dioxide having a rutile structure in an oxygen-deficient state. Titanium oxide containing 24 Ti atoms and 47 O atoms, which is obtained by removing one O atom from titanium oxide containing 24 Ti atoms and 48 O atoms, was used as a model for the simulation. As shown in FIG. 11, in the oxygen-deficient state, Fermi level is in the conductive band and the state density at Fermi level is not zero. From this, it was found that the titanium dioxide with oxygen deficiency has n-type conductivity.

Figure 12:
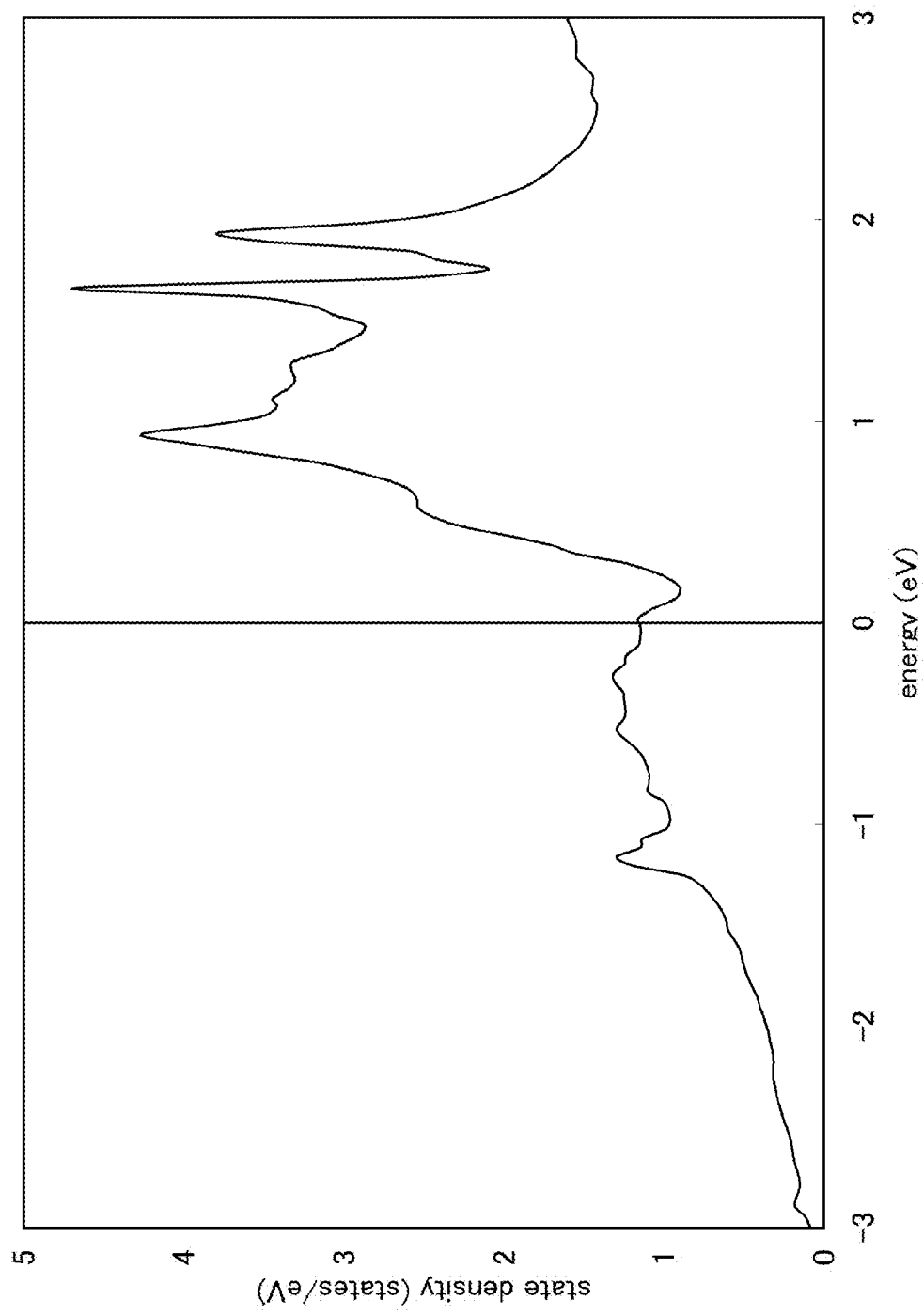
FIG. 12 shows a state density of titanium monoxide.

FIG. 12 shows a state density of titanium monoxide (TiO). As shown in FIG. 12, it was found that titanium monoxide has a state density like that of metal.

From the state density of titanium dioxide in FIG. 10, the state density of titanium dioxide including oxygen deficiency in FIG. 11, and the state density of titanium monoxide in FIG. 12, it was expected that titanium dioxide including oxygen deficiency ($TiO_{2-\delta}$) has n-type conductivity when $0<\delta<1$. Therefore, even in the case where a titanium oxide film (the metal oxide film 60) contains titanium monoxide, or titanium dioxide including oxygen deficiency as its component, current flow is hardly blocked between an In—Ga—Zn—O-based oxide semiconductor film (the oxide semiconductor film 40) and a titanium film (the metal film 70).

Embodiment 4

The thin film transistor described in the above Embodiments can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone set (also referred to as a mobile phone or a mobile phone device), a portable game console, a portable information terminal, an audio reproducing device, a large-sized game machine such as a pachinko machine, a solar panel, and the like. Some examples of the electronic devices to which the thin film transistor described in the above Embodiments is applied are described below with reference to FIGS. 13A and 13B.

Figure 13A:
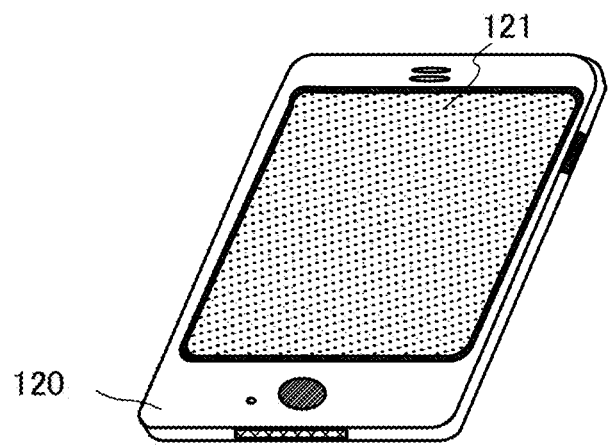
FIGS. 13A and 13B each illustrate an electronic device to which a thin film transistor is applied.

FIG. 13A shows one example of the mobile phone set to which the thin film transistor described in the above Embodiments is applied. This mobile phone set includes a display portion 121 provided in a housing 120.

When the display portion 121 is touched with a finger or the like, data can be input into the mobile phone. In addition, operations such as making calls and composing mails can be also conducted by touching the display portion 121 with a finger or the like.

For example, as a switching element in the pixel of the display portion 121, a plurality of the thin film transistors described in the above Embodiments are arranged; thus, the performance of this mobile phone set can be improved.

Figure 13B:
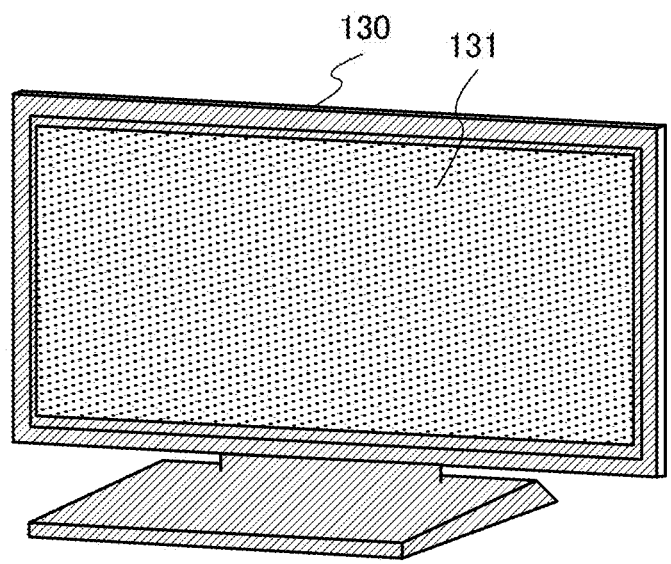

FIG. 13B shows one example of the television set to which the thin film transistor described in the above Embodiments is applied. In this television set, a display portion 131 is provided in a housing 130.

For example, as a switching element in the pixel of the display portion 131, a plurality of the thin film transistors described in the above Embodiments are arranged; thus, the performance of this television set can be improved.

As described above, the thin film transistors described in the above Embodiments are arranged in a display portion of a variety of electric devices; thus, the performance of the electric devices can be improved.

Example 1

Figure 14:
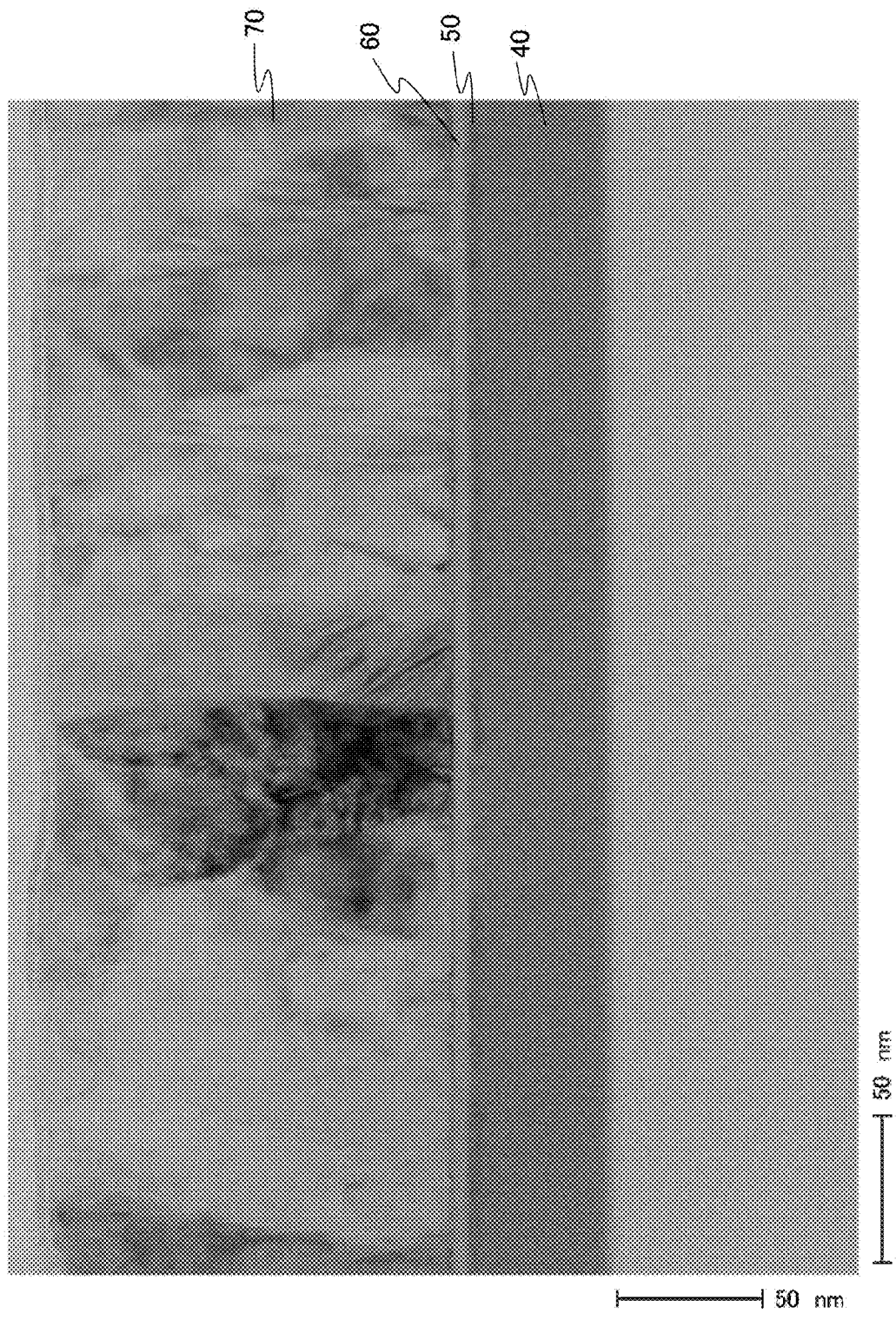
FIG. 14 is a TEM photograph of a thin film transistor including an In—Ga—Zn—O-based oxide semiconductor.

FIG. 14 shows a photograph of a cross section of a thin film transistor in which the In—Ga—Zn—O-based oxide semiconductor is used. The photograph was taken with a transmission electron microscope (TEM: "H-9000 NAR" manufactured by Hitachi, Ltd.) with the acceleration voltage at 300 kV.

The thin film transistor shown in FIG. 14 was obtained in such a manner that an In—Ga—Zn—O-based oxide semiconductor film of 50 nm in thickness was formed as the oxide semiconductor film 40, a first heat treatment (650° C., 1 hour) was performed under a nitride atmosphere, a titanium film of 150 nm in thickness was formed as the metal film 70, and further, a second heat treatment (250° C., 1 hour) was performed under a nitrogen atmosphere.

In FIG. 14, it was confirmed that the metal oxide film 60 was formed at an interface between the oxide semiconductor film 40 and the metal film 70. In addition, it was confirmed that the high metal concentration region 50 was formed in the region in the oxide semiconductor film 40 which is in contact with the metal oxide film 60. Note that, from the results of analysis using a FFTM (fast fourier transform mapping) method, it was found that a crystal having a composition similar to that of indium (In) was formed in the high metal concentration region 50 of this thin film transistor. In the same manner, it was found that a titanium oxide film was formed as the metal oxide film 60.

This application is based on Japanese Patent Application Serial No. 2009-265409 filed on Nov. 20, 2009 with the Japanese Patent Office, the entire contents of which are hereby incorporated by reference.

The invention claimed is:

1. A transistor comprising:
a gate electrode;
a gate insulating film overlapping with the gate electrode;
an oxide semiconductor film overlapping with the gate electrode with the gate insulating film interposed therebetween, the oxide semiconductor film containing metal; and
a titanium film overlapping with the oxide semiconductor film,
wherein the oxide semiconductor film includes a first region and a second region whose concentration of metal is lower than a concentration of metal of the first region,
wherein the metal is at least one of indium, gallium, and zinc,
wherein the first region and the second region overlap with the titanium film,
wherein the first region is closer to the titanium film than the second region,
wherein the first region is in the vicinity of the titanium film, and
wherein a concentration of oxygen in the first region is lower than a concentration of oxygen in the second region.

2. The transistor according to claim 1, wherein a type of the transistor is a bottom gate type.

3. The transistor according to claim 1, wherein the oxide semiconductor film comprises In—Ga—Zn—O-based oxide semiconductor.

4. The transistor according to claim 1, wherein a concentration of hydrogen in the oxide semiconductor film is less than $5\times10^{16}/cm^3$ when the concentration of hydrogen is measured by secondary ion mass spectrometry.

5. The transistor according to claim 1, further comprising a film comprising titanium and oxygen,
wherein the film comprising titanium and oxygen is located between the oxide semiconductor film and the titanium film, and
wherein the film comprising titanium and oxygen overlaps with the first region and the second region.

6. The transistor according to claim 5, wherein the film comprising titanium and oxygen is in contact with the oxide semiconductor film and the titanium film.

7. The transistor according to claim 5, wherein the film comprising titanium and oxygen is a titanium oxide film.

8. The transistor according to claim 1, wherein the first region comprises a crystal grain or a microcrystal including metal.

9. A transistor comprising:
a gate electrode;
a gate insulating film overlapping with the gate electrode;
an oxide semiconductor film overlapping with the gate electrode with the gate insulating film interposed therebetween; and
a titanium film overlapping with the oxide semiconductor film,
wherein the oxide semiconductor film contains at least one of indium, gallium, and zinc,
wherein the oxide semiconductor film includes a first region and a second region whose concentration of indium is lower than a concentration of indium in the first region,
wherein the first region and the second region overlap with the titanium film,
wherein the first region is closer to the titanium film than the second region,
wherein the first region is in the vicinity of the titanium film, and
wherein a concentration of oxygen in the first region is lower than a concentration of oxygen in the second region.

10. The transistor according to claim 9, wherein a type of the transistor is a bottom gate type.

11. The transistor according to claim 9, wherein the oxide semiconductor film comprises In—Ga—Zn—O-based oxide semiconductor.

12. The transistor according to claim 9, wherein a concentration of hydrogen in the oxide semiconductor film is less than $5\times10^{16}/cm^3$ when the concentration of hydrogen is measured by secondary ion mass spectrometry.

13. The transistor according to claim 9, further comprising a film comprising titanium and oxygen,
wherein the film comprising titanium and oxygen is located between the oxide semiconductor film and the titanium film, and
wherein the film comprising titanium and oxygen overlaps with the first region and the second region.

14. The transistor according to claim 13, wherein the film comprising titanium and oxygen is in contact with the oxide semiconductor film and the titanium film.

15. The transistor according to claim 13, wherein the film comprising titanium and oxygen is a titanium oxide film.

16. A transistor comprising:
a gate electrode;
a gate insulating film overlapping with the gate electrode;
an oxide semiconductor film overlapping with the gate electrode with the gate insulating film interposed therebetween;
a film comprising titanium and oxygen, the film comprising titanium and oxygen being in contact with the oxide semiconductor film; and
a titanium film in contact with the film comprising titanium and oxygen,
wherein the oxide semiconductor film contains at least one of indium, gallium, and zinc,
wherein the oxide semiconductor film includes a first region and a second region whose concentration of indium is lower than a concentration of indium in the first region,
wherein the first region and the second region overlap with the film comprising titanium and oxygen,
wherein the first region is closer to the film than the second region,
wherein the first region is in the vicinity of the film comprising titanium and oxygen,
wherein a concentration of oxygen in the first region is lower than a concentration of oxygen in the second region, and
wherein the first region comprises a crystal grain or a microcrystal including indium.

17. The transistor according to claim 16, wherein a type of the transistor is a bottom gate type.

18. The transistor according to claim 16, wherein the oxide semiconductor film comprises In—Ga—Zn—O-based oxide semiconductor.

19. The transistor according to claim 16, wherein a concentration of hydrogen in the oxide semiconductor film is less than $5\times10^{16}/cm^3$ when the concentration of hydrogen is measured by secondary ion mass spectrometry.

20. The transistor according to claim 16, wherein the first region includes a crystal of indium.

* * * * *